(12) United States Patent
Kobayashi et al.

(10) Patent No.: US 8,309,864 B2
(45) Date of Patent: Nov. 13, 2012

(54) DEVICE MOUNTING BOARD AND MANUFACTURING METHOD THEREFOR, AND SEMICONDUCTOR MODULE

(75) Inventors: Hajime Kobayashi, Kumagaya (JP); Yasuyuki Yanase, Gifu (JP); Tetsuya Yamamoto, Hashima (JP); Yoshio Okayama, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 668 days.

(21) Appl. No.: 12/364,084

(22) Filed: Feb. 2, 2009

(65) Prior Publication Data

US 2009/0196011 A1 Aug. 6, 2009

(30) Foreign Application Priority Data

Jan. 31, 2008 (JP) ................. 2008-022013
Feb. 29, 2008 (JP) ................. 2008-050473
Mar. 26, 2008 (JP) ................. 2008-080994

(51) Int. Cl.
*H05K 1/11* (2006.01)
(52) U.S. Cl. ....................................... 174/265
(58) Field of Classification Search .............. 174/265
See application file for complete search history.

(56) References Cited

U.S. PATENT DOCUMENTS

| | | | | |
|---|---|---|---|---|
| 5,600,103 A * | 2/1997 | Odaira et al. | ................. | 174/265 |
| 5,736,681 A * | 4/1998 | Yamamoto et al. | ............ | 174/265 |
| 5,874,780 A * | 2/1999 | Murakami | ................... | 257/775 |
| 6,010,769 A * | 1/2000 | Sasaoka et al. | ................. | 428/209 |
| 6,353,189 B1 * | 3/2002 | Shimada et al. | ................. | 174/255 |
| 6,452,280 B1 * | 9/2002 | Shiraishi et al. | ................. | 257/778 |
| 6,555,209 B1 * | 4/2003 | Yoshimura et al. | ........... | 428/209 |
| 6,583,517 B1 * | 6/2003 | Jimarez | .......................... | 257/781 |
| 6,831,234 B1 * | 12/2004 | Asai et al. | ..................... | 174/261 |
| 7,786,390 B2 * | 8/2010 | Ikeda | ............................. | 174/255 |
| 2003/0137056 A1 * | 7/2003 | Taniguchi et al. | ............. | 257/774 |
| 2009/0250251 A1 | 10/2009 | Shibata et al. | | |

FOREIGN PATENT DOCUMENTS

JP 11-251472 9/1999

(Continued)

OTHER PUBLICATIONS

Japanese Notification of Reasons for Refusal, w/ English language thereof, issued in Japanese Patent Application No. 2008-022013, dated Oct. 25, 2012.
Japanese Notification of Reasons for Refusal, w/ English translation thereof, issued in Japanese Patent Application No. 2008-080994, dated Dec. 13, 2011.

(Continued)

*Primary Examiner* — Chau Nguyen
(74) *Attorney, Agent, or Firm* — McDemott Will & Emery LLP

(57) ABSTRACT

A device mounting board includes: an insulating resin layer; a wiring layer disposed on one main surface of the insulating resin layer; and a bump electrode connected electrically to the wiring layer and protruding on a side of the insulating resin layer from the wiring layer. A side surface of the bump electrode is curved inwardly toward the center axis of the bump electrode as viewed in a cross section including the center axis of the bump electrode, and the radius of curvature of the side surface changes continuously from a wiring layer end to a head end of the bump electrode.

12 Claims, 23 Drawing Sheets

FOREIGN PATENT DOCUMENTS

| | | |
|---|---|---|
| JP | 2002-141629 | 5/2002 |
| JP | 2004-006486 | 1/2004 |
| JP | 2004-193297 | 7/2004 |
| JP | 2004-349361 | 12/2004 |
| JP | 2006-173463 | 6/2006 |
| JP | 2007-157795 | 6/2007 |
| WO | WO 2007/063954 | 6/2007 |

OTHER PUBLICATIONS

Chinese Office Action, and English translation thereof, issued in Chinese Patent Application No. 200910134693.2 dated Nov. 3, 2011.
Chinese Office Action, and English translation thereof, issued in Chinese Patent Application No. 200910134693.2 dated Jul. 31, 2012.

* cited by examiner

30

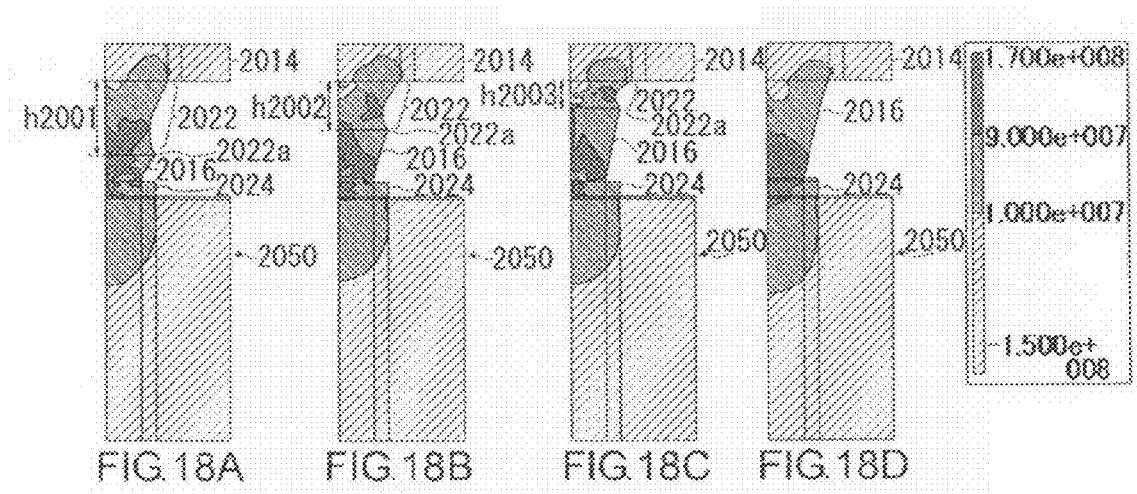

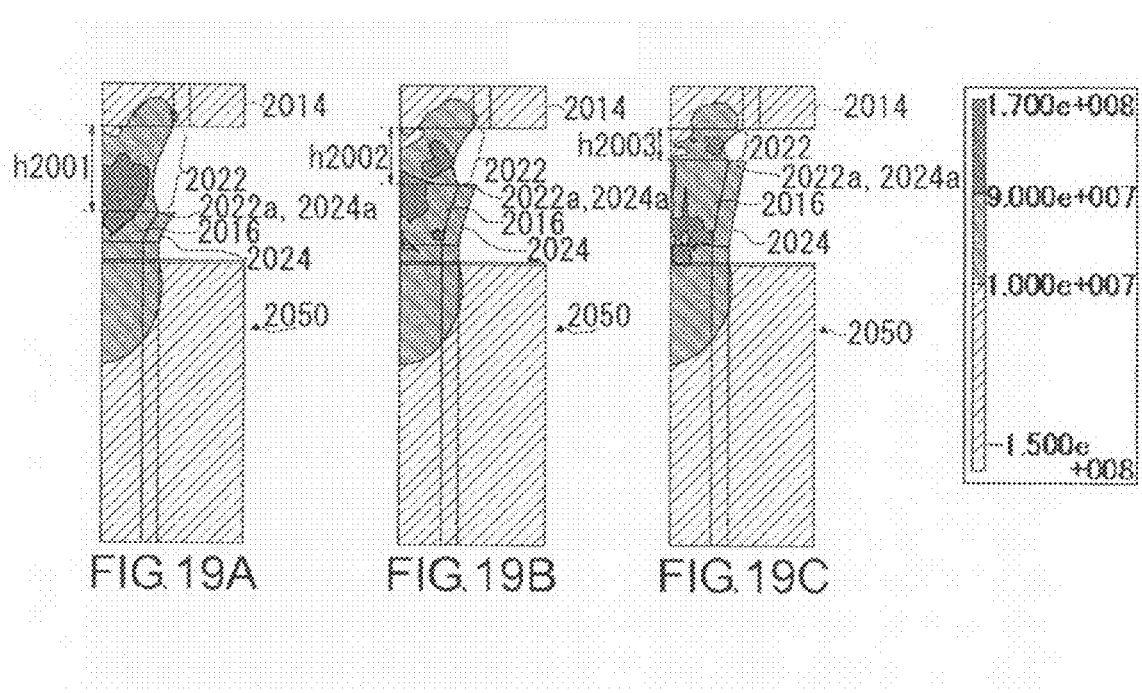

DEVICE MOUNTING BOARD AND MANUFACTURING METHOD THEREFOR, AND SEMICONDUCTOR MODULE

CROSS-REFERENCE TO RELATED APPLICATIONS

This application is based upon and claims the benefit of priority from the prior Japanese Patent Applications No. 2008-022013, filed Jan. 31, 2008, Japanese Patent Application No. 2008-050473, filed Feb. 29, 2008, and Japanese Patent Application No. 2008-080994, filed Mar. 26, 2008, the entire contents of which are incorporated herein by reference.

BACKGROUND OF THE INVENTION

1. Field of the Invention

The present invention relates to a device mounting board and a manufacturing method therefor, and a semiconductor module.

2. Description of the Related Art

A known method of surface-mounting a semiconductor device is flip-chip mounting in which solder bumps are formed on electrodes of the semiconductor device and the solder bumps are connected to an electrode pad of a printed wiring substrate. For example, a CSP (Chip Size Package) is known as a structure employing the flip-chip mounting.

In a semiconductor module having a CSP structure, thermal stress occurs between a printed wiring substrate and the semiconductor module due to a difference in thermal expansion coefficients between the printed wiring board and the semiconductor module in a usage environment or the like. To cope with this, a structure is known where a plurality of recesses are provided on the wiring in approximately the same direction in which a semiconductor chip expands and contracts due to the thermal stress, in such a manner as to be slightly apart from each other. This structure is used to reduce the thermal stress occurring between the printed wiring board and the semiconductor module due to a difference in thermal expansion coefficients between the printed wiring board and the semiconductor module in a usage environment and the like.

With miniaturization and higher performance in electronic devices in recent years, demand has been ever greater for further miniaturization of semiconductor devices used in the electronic devices. With such miniaturization of semiconductor devices, it is of absolute necessity that the pitch of electrodes to enable mounting on the printed wiring board be made narrower. With this flip-chip method, however, there are restrictive factors for the narrowing of the pitch of electrodes, such as the size of the solder bump itself and the bridge formation at soldering. As one structure used to overcome these limitations, known is a structure where a bump structure formed on a substrate is used as an electrode or a via, and the electrodes of the semiconductor device are connected to the bump structure by mounting the semiconductor device on a substrate with an insulating resin, such as epoxy resin, held between the semiconductor device and the substrate.

As another structure used to overcome these limitations, known is a structure where a bump structure formed on a wiring layer made of a metal such as copper is used as an electrode or a via, and the electrodes of the semiconductor device are connected to the bump structure by mounting the semiconductor device on a substrate with an insulating resin, such as epoxy resin, held between the semiconductor device and the substrate.

Also, a structure is known where a circuit terminal electrode and a metal-pasted bump are covered with a Ni plating layer and an Au plating layer, in a structure where the metal-pasted bump is projected from the circuit terminal electrode provided on one main surface of a substrate toward a sealing member such as epoxy resin.

In the above structure where the bump structure formed on a substrate is connected to the electrode of a semiconductor device, there is concern that the thermal stress caused by a difference in thermal expansion coefficients between the substrate and the semiconductor device may be concentrated on the bump structure. As a result, cracks may be caused in the bump structure and therefore the reliability of connection between the semiconductor device and the printed wiring board may drop.

Also, in the above structure where the bump structure formed on a wiring layer is connected to the electrode of a semiconductor device, a metal such as conductive copper is generally used for a material that constitutes the bump structure. Accordingly, the thermal expansion coefficient differs in between the wiring layer or bump structure and the insulating resin layer. As a result, the thermal stress occurs due to the change in temperature in the heat treatment or usage environment and therefore this thermal stress may be concentrated on the bump structure. As a consequence, cracks may be caused in the bump structure and therefore the reliability of connection between the semiconductor device and the printed wiring board may drop.

Also, when the above-described structure where the electrode and the bump are covered with a Ni plating layer and an Au plating layer is applied to a structure where a device mounting board and a semiconductor device are stacked together by press-bonding a bump structure provided on a wiring layer of the device mounting board and an electrode of the semiconductor device with an insulating resin layer held between the bump structure and the semiconductor device, the connection reliability between the wiring layer and the bump structure improves. However, in the structure where the device mounting board and the semiconductor device are stacked together, the thermal stress that occurs due to the change in temperature in the heat treatment or usage environment may be concentrated on the neighborhood of an interconnector between a bump structure and the electrode of the semiconductor device. Then the connection reliability between the bump structure and the electrodes of the semiconductor device may drop.

SUMMARY OF THE INVENTION

One embodiment of the present invention relates to a device mounting board. This device mounting board comprises: an insulating resin layer; a wiring layer disposed on one main surface of the insulating resin layer; and a bump electrode connected electrically to the wiring layer and protruding on a side of the insulating resin layer from the wiring layer, wherein a side surface of the bump electrode is curved inwardly toward a center axis of the bump electrode as viewed in a cross section including the center axis thereof, and a radius of curvature of the side surface thereof changes continuously from a wiring layer end to a head end thereof.

Another embodiment of the present invention relates to a bump electrode structure. This bump electrode structure includes a bump electrode, connected electrically to a wiring layer constituting a device mounting board, which protrudes from the wiring layer at an end thereof, wherein a side surface of the bump electrode on a side to which the wiring layer extends has a milder slope than that on a side opposite thereto.

Still another embodiment of the present invention relates to a bump electrode structure. This bump electrode structure includes a bump electrode, connected electrically to a wiring layer constituting a device mounting board, which protrudes from the wiring layer, wherein a constricted portion is provided in a predetermined area of a side surface of the bump electrode.

It is to be noted that any arbitrary combinations or rearrangement, as appropriate, of the aforementioned constituting elements and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which:

FIGS. 18A to 18D are schematic diagrams showing results, calculated through simulation, of a relationship between an area of a constricted portion and a change in thermal stress occurring in an atmosphere whose temperature varies from 25° C. to 125° C.

FIG. 19A to FIG. 19C are schematic diagrams showing results, calculated through simulation, of a relationship between areas of constricted portion and metallic layer and a change in thermal stress occurring in an atmosphere whose temperature varies from 25° C. to 125° C.

DETAILED DESCRIPTION OF THE INVENTION

Figure 1:
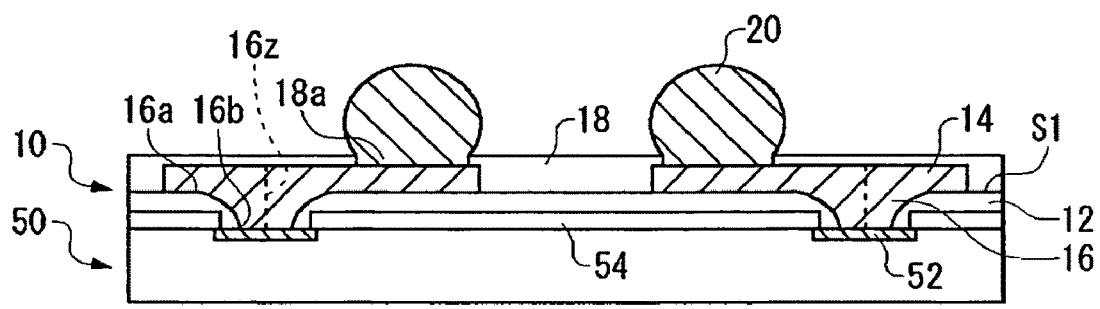
FIG. 1 is a schematic cross-sectional view showing a structure of a device mounting board and a semiconductor module according to a first embodiment of the present invention.

The invention will now be described by reference to the preferred embodiments. This does not intend to limit the scope of the present invention, but to exemplify the invention.

The embodiments will now be described with reference to drawings. Note that in all of the Figures the same components, parts and processings are given the same reference numerals and the repeated description thereof is omitted as appropriate. Moreover, the embodiments given are for illustrative purposes only and all features and their combination thereof described in the present embodiment are not necessarily essential to the invention.

First Embodiment

FIG. 1 is a schematic cross-sectional view illustrating a structure of a device mounting board 10 according to a first embodiment of the present invention and a structure of a semiconductor module 30 using said device mounting board 10. The semiconductor module 30 includes a device mounting board 10 and a semiconductor device 50 mounted on the device mounting board 10.

The device mounting board 10 includes an insulating resin layer 12, a wiring layer 14 provided on one main surface S1 of the insulating resin layer 12, and a bump electrode 16, connected electrically to the wiring layer 14, which protrudes on a side of the insulating resin layer 12 from the wiring layer 14.

The insulating resin layer 12 is made of insulating resin and is formed of, for example, a material that develops plastic flow when pressurized. An example of the material that develops plastic flow when pressurized is epoxy thermosetting resin. The epoxy thermosetting resin to be used for the insulating resin layer 12 may be, for example, one having viscosity of 1 kPa·s under the conditions of a temperature of 160° C. and a pressure of 8 MPa. If a pressure of 5 to 15 MPa is applied to this epoxy thermosetting resin at a temperature of 160° C., then the viscosity of the resin will drop to about ⅛ of the viscosity thereof with no pressurization. In contrast to this, an epoxy resin in B stage before thermosetting has no viscosity, similarly to a case when the resin is not pressurized, under a condition that the temperature is less than or equal to a glass transition temperature Tg. And the epoxy resin develops no viscosity even when pressurized under a condition that the temperature is less than or equal to the glass transition temperature Tg. Also, this epoxy thermosetting resin is a dielectric substance having a permittivity of about 3 to 4.

The wiring layer 14 is provided on one main surface S1 of the insulating resin layer 12 and is formed of a conducive material, preferably a rolled metal or more preferably a rolled copper. Or the wiring layer 14 may be formed of electrolyte copper or the like. The bump electrode 16 is provided, in a protruding manner, on the insulating resin layer 12 side. Although in the first embodiment the wiring layer 14 and the bump electrode 16 are formed integrally with each other, the structure is not particularly limited thereto. A protective layer 18 is provided on a main surface of the wiring layer 14 opposite to the insulating resin layer 12. This protective layer 18 protects the wiring layer 14 against oxidation or the like. The protective layer 18 may be a solder resist layer, for instance. An opening 18a is formed in a predetermined position of the protective layer 18, and the wiring layer 14 is partially exposed there. A solder bump 20, which functions as an external connection electrode, is formed within the opening 18a. And the solder bump 20 and the wiring layer 14 are electrically connected to each other. The position in which the solder bump 20 is formed, namely, the area in which the opening 18a is formed is, for instance, a targeted position where circuit wiring is extended through a rewiring.

The overall shape of the bump electrode 16 is narrower toward the tip portion thereof, and the cross-sectional shape thereof is curved like the shape of Mt. Fuji (a trapezoidal shape with sides being inwardly curved). In this first embodiment, the planar view of the bump electrode 16 is an approximately round shape including the shape of an ellipse. It is to be noted here that the shape of the bump electrode 16 is not limited to this shape and may be polygonal, such as quadrangular, instead of round. A side surface of the bump electrode 16 is curved inwardly toward the center axis of the bump electrode 16 as viewed in a cross section including the center axis of the bump electrode 16 and, at the same time, the radius of curvature of the side surface changes continuously from a wiring layer end 16a to a head end 16b. Here, the radius of curvature is smaller in the middle region than in regions closer to the wiring layer end 16a and the head end 16b. That is, the side of the bump electrode 16 is of a shape such that the radius of curvature changes in the order of "being large"→"being small"→"being large" from the wiring layer end 16a toward the head end 16b. The ratio of the top to the base of the bump electrode 16 is preferably in the range of about 0.25 to about 0.60.

There are cases where fine asperities of less than or equal to about 2 to about 5 μm are formed on the side surface of the bump electrode 16. The side surface of the bump electrode according to the first embodiment is of a shape such that the radius of curvature of the side surface changes continuously without taking these fine asperities into account. The surface of the bump electrode 16 may be covered with a metallic layer, such as a Ni(nickel)/Au(gold) plating layer, formed by electrolytic plating or electroless plating, for example.

The semiconductor device 50 is mounted on the device mounting board 10 having the above-described structure so as to form the semiconductor module 30. The semiconductor module 30 according to the first embodiment is structured such that a bump electrode 16 of the device mounting board 10 is electrically connected to a device electrode 52 of the semiconductor device 50 through the medium of the insulating resin layer 12 interposed therebetween.

The semiconductor device 50 has device electrodes 52 disposed counter to the bump electrodes 16, respectively. An element protective layer 54, in which openings are provided so that the device electrodes 52 can be exposed from the openings, is stacked on the main surface of the semiconductor device 50 on the side thereof in contact with the insulating resin layer 12. A metallic layer, such as a Ni/Au plating layer, may cover the surface of the device electrode 52. A specific example of the semiconductor device 50 is a semiconductor chip such as an integrated circuit (IC) or a large-scale integrated circuit (LSI). A specific example of the element protective layer 54 is a polyimide layer. For example, aluminum (Al) is used as the device electrode 52.

In the first embodiment, the insulating resin layer 12 is provided between the device mounting board 10 and the semiconductor device 50. The device mounting board 10 is press-bonded to one main surface S1 of the insulating resin layer 12 whereas the semiconductor device 50 is press-bonded to the other main surface thereof. The bump electrode 16, which penetrates the insulating resin layer 12, is electrically connected to the device electrode 52 provided on the semiconductor device 50. A material that develops plastic flow when pressured is used for the insulating resin layer 12. As a result, when the device mounting board 10, the insulating resin layer 12 and the semiconductor device 50 are press-bonded in this order and united into one body, the probability that a residual film of insulating resin layer 12 will stay on at an interface between the bump electrode 16 and the device electrode 52 is suppressed. Hence, the connection reliability is improved. If the surfaces of the bump electrode 16 and the device electrode 52 are covered with Ni/Au plating layers, the bump electrode 16 and the device electrode 52 will be bonded to each other on the golds disposed on their respective outermost surfaces (Au—Au bonding). Hence, the connection reliability between the bump electrode 16 and the device electrode 52 is further improved.

(Method for Manufacturing a Device Mounting Board and a Semiconductor Module)

FIGS. 2A to 2D are cross-sectional views showing a process in a method for forming the bump electrodes 16.

Figure 2A:
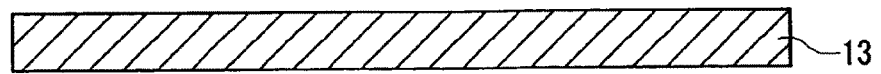
FIGS. 2A to 2D are cross-sectional views showing a process in a method for forming bump electrodes.

As illustrated in FIG. 2A, a copper sheet 13 is prepared as a metallic sheet having a thickness greater than at least the sum of the height of the bump electrode 16 and the thickness of the wiring layer 14.

Figure 2B:
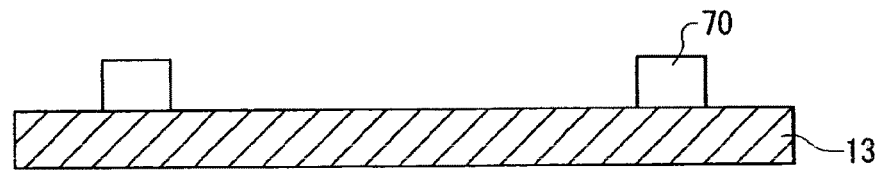

Then, as shown in FIG. 2B, resists 70 are formed selectively in alignment with a pattern of bump electrodes 16 using a lithography method. More specifically, a resist film of predetermined film thickness is affixed to the copper sheet 13 by a laminator unit, and it is then subjected to exposure using a photo mask having the pattern of bump electrodes 16. After this, the resists 70 are selectively formed on the copper sheet 13 by a development. To improve the adhesion of the resists 70 to the copper sheet 13, it is desirable that a pretreatment, such as grinding, cleaning and the like, be performed as necessary on the surface of the copper sheet 13 before the lamination of the resist film thereon.

Figure 2C:
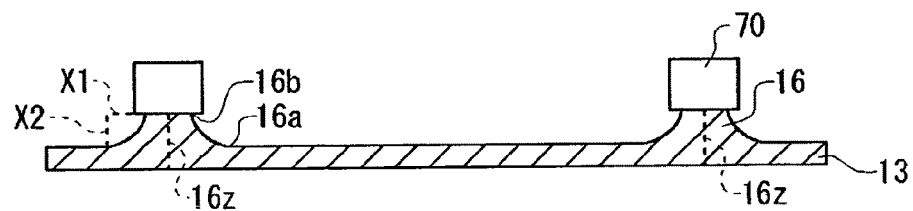

Then, as shown in FIG. 2C, bump electrodes 16 having a predetermined pattern are formed on the copper sheet 13 using the resist 70 as a mask. Specifically, the bump electrodes 16 having a predetermined pattern is formed by performing a shower etching on the copper sheet 13, in which an etchant of ferric chloride solution or the like is sprayed to a main surface of the copper sheet 13 brought on a conveyor. The main surface meant here is the side on which the resist 70 is formed. The shower etching enables an anisotropic etching of the copper sheet 13 such that the side surface of the bump electrode 16 may be curved inwardly toward a center axis 16z of the bump electrode 16 (center axis of the mask), with a radius of curvature thereof changing continuously. The shower etching can also form the side surface of the bump electrode 16 such that a distance X2 between a wiring layer end 16a and a head end 16b in the direction parallel to the center axis 16z is greater than a distance X1 between the wiring layer end 16a and the head end 16b in the direction perpendicular to the center axis 16z, for instance. In the first embodiment, the conveyance speed of the copper sheet 13 is about 4 to about 7 m/min, and the spraying pressure of the etchant is about 200 to about 500 kPa.

Figure 2D:
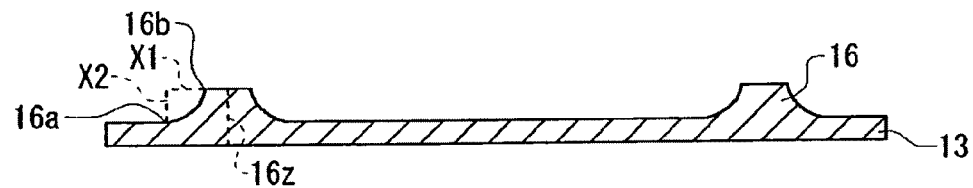

Then, as shown in FIG. 2D, the resists 70 are removed using a stripping agent. Thus bump electrodes 16 are formed on the copper sheet 13 through a process as described above. The diameter of the base, the diameter of the top, and the height of the bump electrode 16 according to the first embodiment are about 100 to about 140 μmφ, about 50 μmφ, and about 30 μmφ, respectively. Also, it can be appreciated by those skilled in the art that the bump electrode 16 may be formed in various shapes by changing the conveyance speed or conveyance distance of the copper sheet 13, the spraying pressure of the etchant, the number of nozzles, the diameter of the nozzles, and so forth. These conditions may be determined by conducting experiments.

FIGS. 3A to 3E are process cross sections showing a method for forming a wiring layer 14 and connecting bump electrodes 16 with device electrodes 52.

Figure 3A:
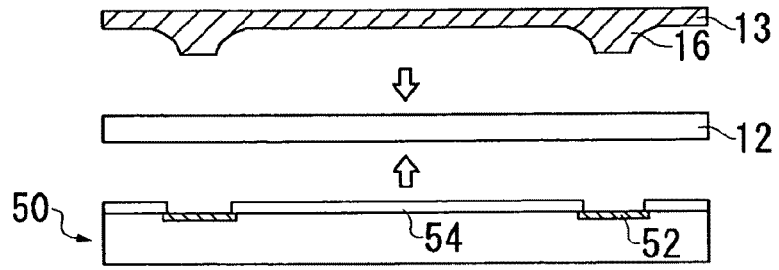
FIGS. 3A to 3E are cross-sectional views showing a process in a method for forming a wiring layer and connecting bump electrodes with device electrodes.

As shown in FIG. 3A, a copper sheet 13 is positioned on a main surface S1 side of an insulating resin layer 12 such that the bump electrodes 16 face the insulating resin layer 12. A semiconductor device 50 provided with the device electrodes 52, which are located opposite to the bump electrodes 16, is positioned on the other main surface of the insulating resin layer 12. The thickness of the insulating resin layer 12 is about the height of the bump electrode 16, or approximately 30 μm. Then the copper sheet 13 and the semiconductor device 50 are press-bonded together with the insulating resin layer 12 interposed therebetween, using a press machine. The pressure and temperature to be employed in the press-forming are about 5 MPa and about 180° C., respectively.

Figure 3B:
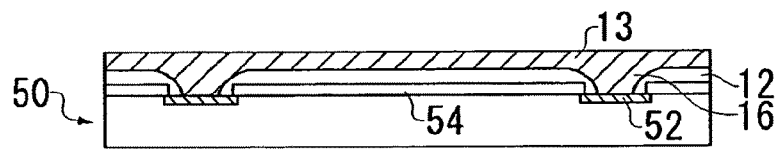

As the insulating resin layer 12 develops a plastic flow in the press-forming, the bump electrodes 16 penetrate the insulating resin layer 12. Then, as shown in FIG. 3B, the copper sheet 13, the insulating resin layer 12, and the semiconductor device 50 are integrated into a single block with the result that the bump electrodes 16 and the device electrodes 52 are press-bonded and thus electrically coupled with each other. The bump electrodes 16 penetrate the insulating resin layer 12 smoothly because the bump electrodes 16 are generally shaped with the diameter being smaller toward the head thereof. In the first embodiment, by press-bonding the copper sheet 13 to the insulating resin layer 12, the insulating resin layer 12 is layered on the main surface of the copper sheet 13 where the bump electrodes 16 are formed.

Figure 3C:
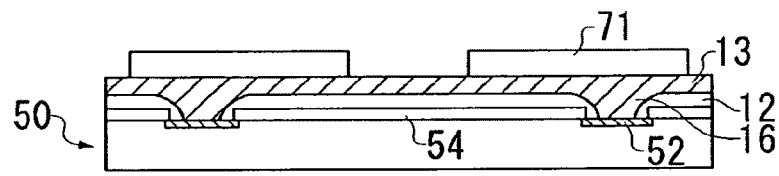

Then, as shown in FIG. 3C, resists 71 are formed selectively in alignment with a pattern of a wiring layer 14 on the main surface of the copper sheet 13, which is on the side opposite to the insulating resin layer 12, using a lithography method.

Figure 3D:
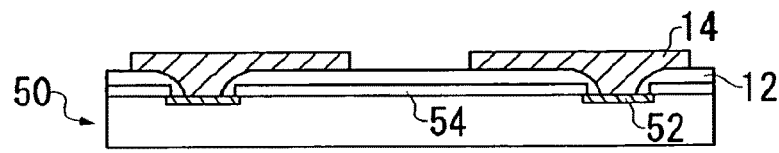

Then, as shown in FIG. 3D, the wiring layer 14 having a predetermined pattern is formed in the copper sheet 13 by etching the main surface of the copper sheet 13 using the resists 71 as a mask. After that, the resists 71 are removed. The thickness of the wiring layer 14 according to the first embodiment is about 20 μm.

Figure 3E:
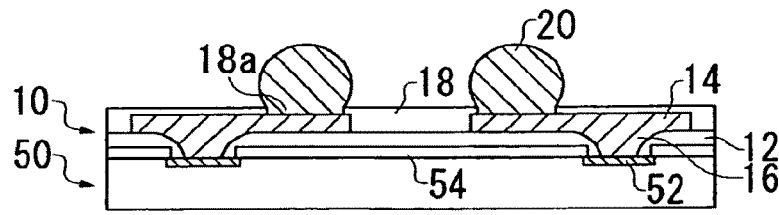

Then, as shown in FIG. 3E, a protective layer 18, which has openings 18a in regions corresponding to the positions for the formation of solder bumps 20, is formed on the main surface of the wiring layer 14, which is on the side opposite to the insulating resin layer 12, using a lithography method. Then the solder bumps 20 are formed within the openings 18a.

Thus, the semiconductor module 30 is manufactured through processes as described above. Or, where the semiconductor device 50 is not mounted, the device mounting board 10 is obtained.

FIGS. 4A to 4D are schematic depictions for explaining the relationship between the structure of a bump electrode 16 and the maximum stress occurring in the bump electrode 16 or the bump electrode forming region of a wiring layer 14 in an ambience where the temperature is changed from 25° C. to 125° C. FIGS. 5A to 5C are graphs showing changes in the radius of curvature of the side surfaces of bump electrodes 16.

Figure 4A:
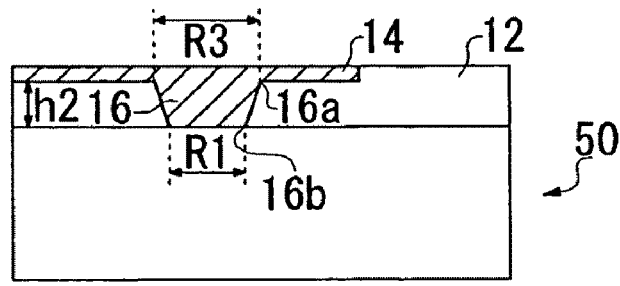
FIGS. 4A to 4D are schematic depictions for explaining the relationship between the structure of a bump electrode and the maximum stress occurring in the bump electrode or a bump electrode forming region of a wiring layer in an ambience where the temperature is changed from 25° C. to 125° C.

The side surface of a bump electrode 16 as shown in FIG. 4A is linear, which is the cross-sectional shape of a conventional bump electrode. On the other hand, the side surface of a bump electrode 16 as shown in FIGS. 4B to 4D is approximately in a spline curve drawn between a wiring layer end 16a and a head end 16b of the side surface passing through an intermediate point 16c therebetween, which is the shape of the bump electrode of the present embodiment.

Figure 4B:
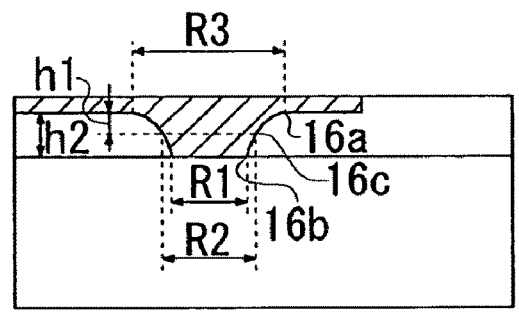
Figure 4C:
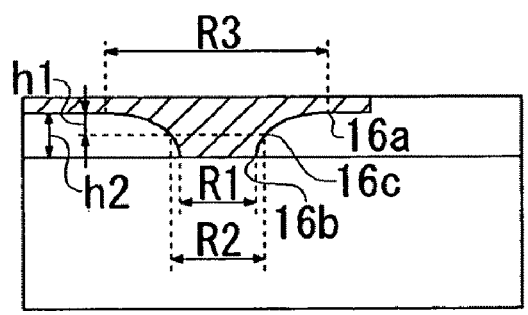
Figure 4D:
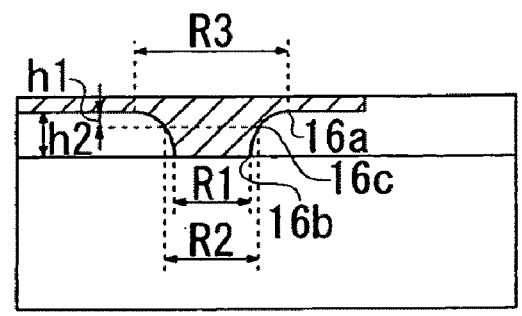
Figure 5A:
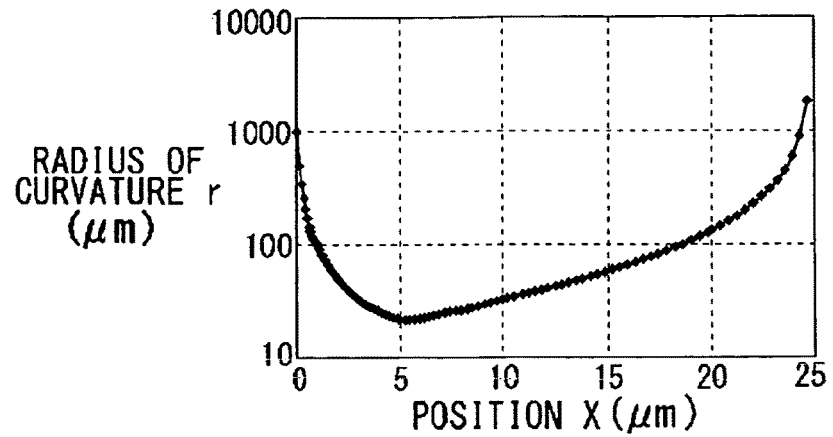
FIGS. 5A to 5C are graphs showing changes in the radius of curvature of the side surfaces of bump electrodes.
Figure 5B:
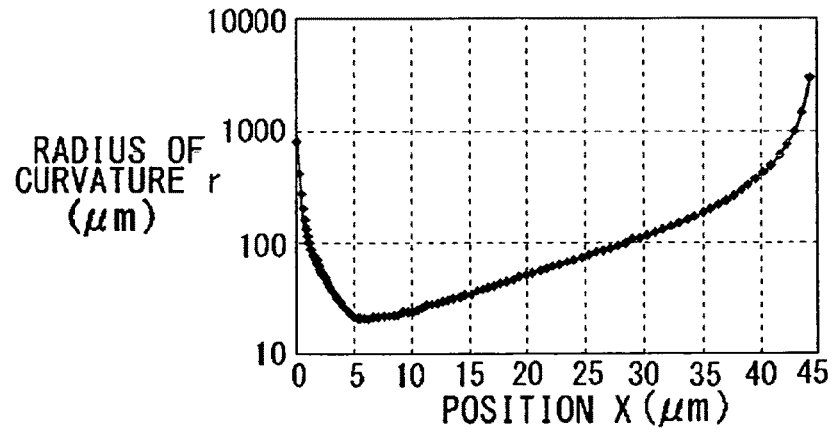
Figure 5C:
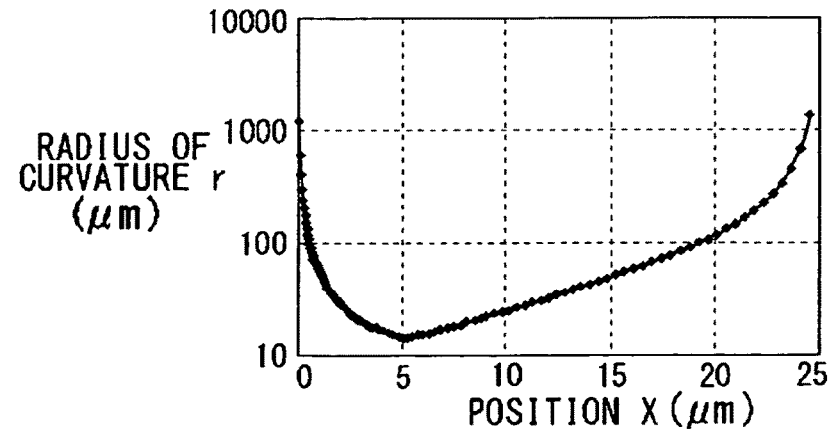

In FIGS. 4B to 4D, the bump electrodes 16 have different diameters R3 of the base portion thereof and heights h1 of the intermediate points 16c from the wiring layer 14 from each other. However, the height h2 of the bump electrodes 16, the diameter R1 of the head portion thereof, and the diameter R2 at the height of the intermediate points 16c are fixed. Table 1 presents the dimensions of the bump electrodes shown in FIGS. 4A to 4D and the ratios of the head diameter to the base diameter thereof.

TABLE 1

|     | R1 (μm) | R2 (μm) | R3 (μm) | h1 (μm) | h2 (μm) | RATIO OF HEAD DIAMETER TO BASE DIAMETER |
|-----|---------|---------|---------|---------|---------|-----------------------------------------|
| (A) | 50      | —       | 70      | —       | 30      | 0.71                                    |
| (B) | 50      | 60      | 100     | 15      | 30      | 0.5                                     |
| (C) | 50      | 60      | 140     | 15      | 30      | 0.36                                    |
| (D) | 50      | 60      | 100     | 10      | 30      | 0.5                                     |

As can be seen from Table 1 and FIG. 4, the bump electrode 16 of FIG. 4C has a larger diameter R3 of the base portion and a smaller ratio of the head diameter to the base diameter than those of the bump electrode 16 of FIGS. 4B and 4D. That is, the bump electrode 16 of FIG. 4C has a longer distance in the X-axis direction between the wiring layer end 16a and the head end 16b than that of the bump electrodes 16 of FIGS. 4B and 4D, which means a wider region in which the radius of curvature changes continuously. In other words, the bump electrode 16 of FIG. 4C has a more widely and gently sloped side surface than that of the bump electrodes 16 of FIGS. 4B and 4D. On the other hand, the difference between the bump electrode 16 of FIG. 4B and the bump electrode 16 of FIG. 4D is such that the former has a height of the intermediate point 16c greater than that of the latter.

FIGS. 5A to 5C show the relationships between the radius of curvature r and the position in the direction parallel to the main surface of the wiring layer 14 (X-axis direction) of the side surface of the bump electrodes 16 of FIGS. 4B to 4D, respectively. Note that the head end 16b of the bump electrodes 16 is the starting point (X=0) of the graphs. As can be seen from FIGS. 5A to 5C, the side surfaces of the bump electrodes 16 have their radius of curvature r changing continuously from the wiring layer end 16a to the head end 16b. Also, a minimal value of the radius of curvature r is present between the wiring layer end 16a and the head end 16b, and the radius of curvature r is smaller in the middle region than in regions closer to the wiring layer end 16a or the head end 16b.

In an inventors' experiment, the maximum stresses occurring in the bump electrodes 16 as shown in FIGS. 4A to 4D in an ambience where the temperature was changed from 25° C. to 125° C. were 291 MPa, 244 MPa, 222 MPa, and 248 MPa, respectively. The results showed that the maximum stress occurring in the bump electrode is lower in the bump electrodes 16 of the present embodiment having curved side surfaces than in the conventional one having a linear side surface. Also, among the bump electrodes 16 of the present embodiment, it was seen that the maximum stress is lower when the distance in the X-axis direction between the wiring layer end 16a and the head end 16b is longer.

As described so far, the device mounting board 10 according to the first embodiment has a side surface of the bump electrode 16 curved inwardly toward the center axis 16z of the bump electrode 16 as viewed in a cross section including the center axis 16z, with the radius of curvature of the side surface changing continuously from the wiring layer end 16a to the head end 16b thereof. Hence, the device mounting board 10 is less likely to suffer the concentration of thermal stress in the bump electrode 16 in situations where a semiconductor module 30 is fabricated or mounted to a printed wiring board or where thermal stress can occur in a usage environment. In consequence, there will be less likelihood of cracking or breakage in the bump electrodes 16 or the joints of the bump electrode 16 and the wiring layer 14, which in turn will improve the connection reliability between the device mounting board 10 and the semiconductor device 50. Further, when a semiconductor module 30 is mounted on a printed wiring board, the connection reliability between the semiconductor device 50 and the printed wiring board will be improved. Also, the reduced likelihood of breakage of bump electrodes 16 raises the production yield of semiconductor modules, thus lowering their manufacturing costs.

Second Embodiment

As a result of careful investigation, the inventors have realized that thermal stress can be concentrated more in the side surface of the bump electrode on the side to which the wiring layer extends than in the side surface thereof on the opposite side. They have also found that when the insulating resin layer is approximately square in shape in a plan view, thermal stress tends to be concentrated in the side surface, on the side to which the wiring layer extends, of the bump electrode located close to corners (edges) of the insulating resin layer. And the second embodiment had been conceived by the inventors based on these realizations.

Figure 6:
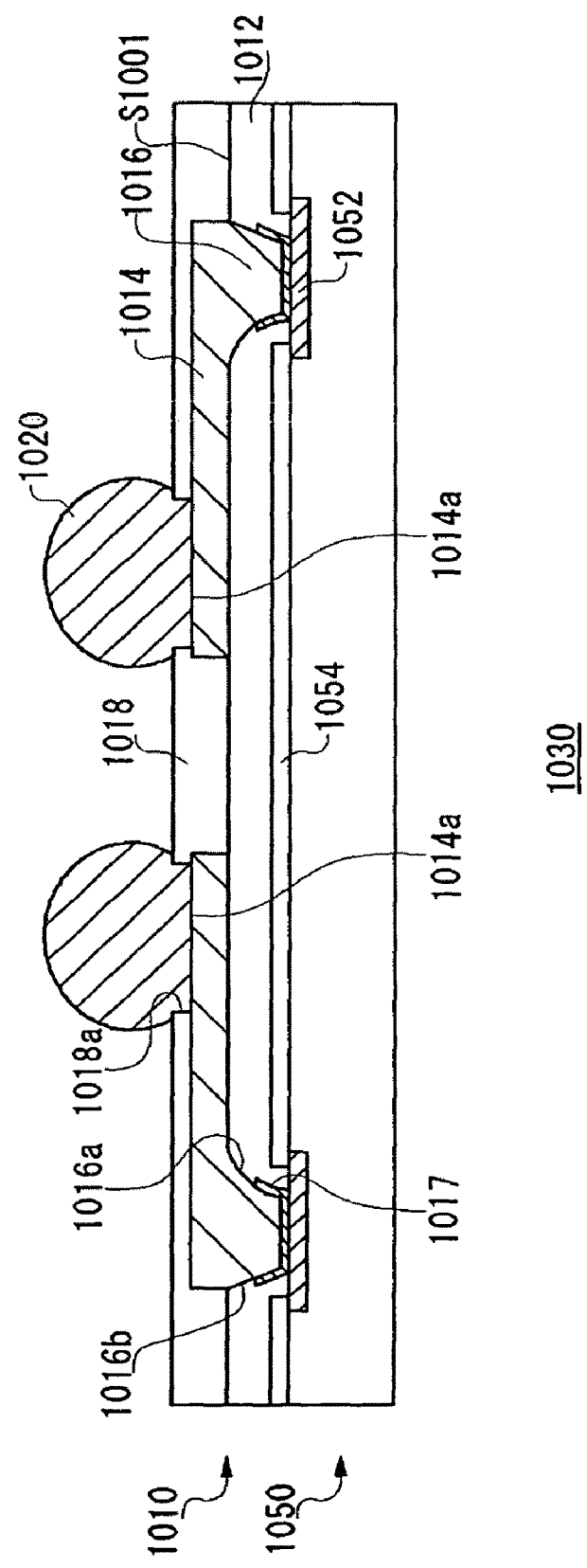
FIG. 6 is a schematic cross-sectional view showing a structure of a device mounting board and a semiconductor module according to a second embodiment of the present invention.

FIG. 6 is a schematic cross-sectional view illustrating a structure of a device mounting board 1010 having a bump structure according to a second embodiment of the present invention and a structure of a semiconductor module 1030 using said device mounting board 1010. The semiconductor module 1030 includes a device mounting board 1010 and a semiconductor device 1050 mounted on the device mounting board 1010.

The device mounting board 1010 includes an insulating resin layer 1012, a wiring layer 1014 provided on one main surface S1001 of the insulating resin layer 1012, and a bump electrode 1016, connected electrically to the wiring layer 1014, which protrudes on a side of the insulating resin layer 1012 from the wiring layer 1014 at one end of the wiring layer 1014.

The insulating resin layer 1012 is made of insulating resin and is formed of, for example, a material that develops plastic flow when pressurized. An example of the material that develops plastic flow when pressurized is epoxy thermosetting resin. The epoxy thermosetting resin to be used for the insulating resin layer 1012 may be, for example, one having viscosity of 1 kPa·s under the conditions of a temperature of 160° C. and a pressure of 8 MPa. If a pressure of 5 to 15 MPa is applied to this epoxy thermosetting resin at a temperature of 160° C., then the viscosity of the resin will drop to about ⅛ of the viscosity thereof with no pressurization. In contrast to this, an epoxy resin in B stage before thermosetting has no viscosity, similarly to a case when the resin is not pressurized, under a condition that the temperature is less than or equal to a glass transition temperature Tg. And the epoxy resin develops no viscosity even when pressurized under a condition that the temperature is less than or equal to the glass transition temperature Tg.

The wiring layer 1014 is provided on one main surface S1001 of the insulating resin layer 1012 and is formed of a conducive material, preferably a rolled metal or more preferably a rolled copper. Or the wiring layer 1014 may be formed of electrolyte copper or the like. The bump electrode 1016 is provided, in a protruding manner, on the insulating resin layer 1012 side at one end of the wiring layer 1014. It is preferable that the wiring layer 1014 and the bump electrode 1016 be formed integrally with each other. Such a structure prevents the occurrence of cracks or the like due to the thermal stress at an interface between the wiring layer 1014 and the bump electrode 1016. Also, the connection between the wiring layer 1014 and the bump electrode 1016 is assured as compared when they are each a separate item. Moreover, the device electrode 1052 and the wiring layer 1014 are electrically connected simultaneously when the wiring layer 1014 is press-bonded, and therefore another advantageous effect of not increasing the number of processes is achieved. A protective layer 1018 is provided on the main surface of the wiring layer 1014 opposite to the insulating resin layer 1012. This protective layer 1018 protects the wiring layer 1014 against oxidation or the like. The protective layer 1018 may be a solder resist layer, for instance. An opening 1018a is formed in a predetermined position of the protective layer 1018, and the wiring layer 1014 is partially exposed there. A solder bump 1020, which functions as an external connection electrode, is formed within the opening 1018a. And the solder bump 1020 and the wiring layer 1014 are electrically connected to each other. The position in which the solder bump 1020 is formed, namely, the region in which the opening 1018a is formed is, for instance, a targeted position where circuit wiring is extended through a rewiring.

Figure 7A:
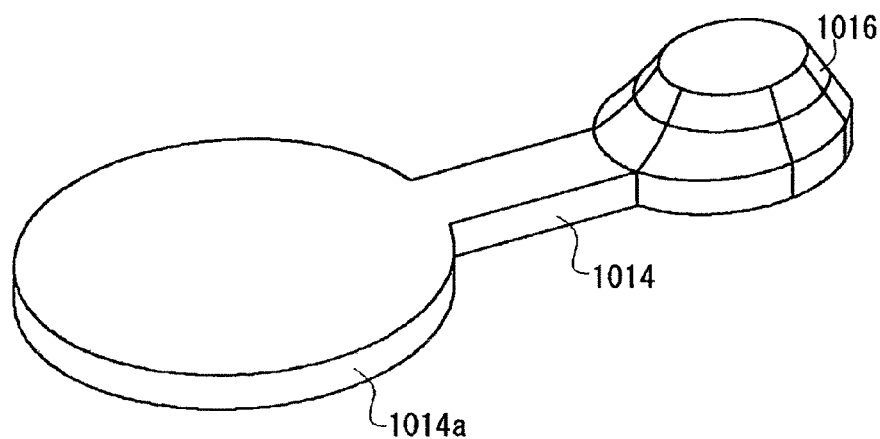
FIGS. 7A and 7B are schematic diagrams to explain a shape of a bump electrode.
Figure 7B:
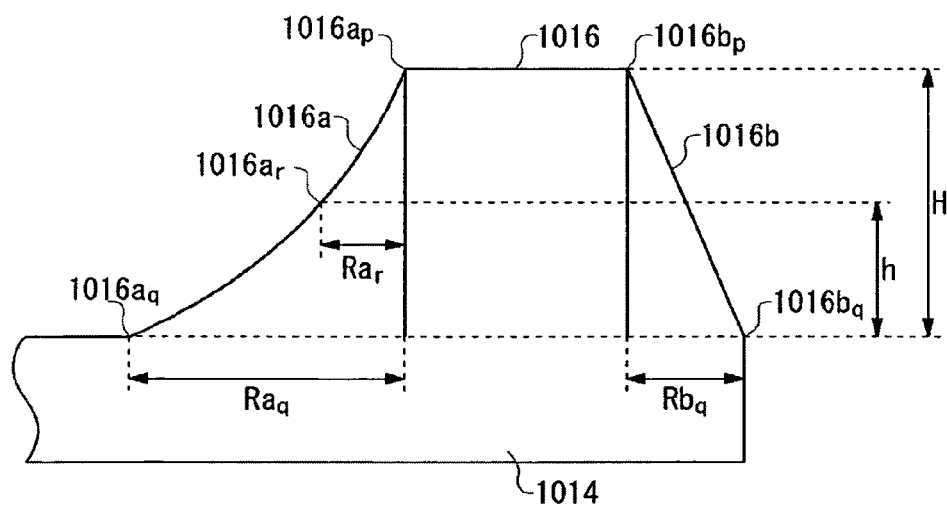

FIGS. 7A and 7B are schematic diagrams to explain the shape of the bump electrode 1016. FIG. 7A is a schematic perspective view of the bump electrode 1016 and the wiring layer 1014. FIG. 7B is a schematic diagram showing a cross section of the bump electrode 1016.

As shown in FIGS. 7A and 7B, the overall shape of the bump electrode 1016 is such that the diameter thereof is narrower toward the tip portion thereof, and a side surface 1016a of the bump electrode 1016 on a side to which the wiring layer 1014 extends has a milder slope than a side surface 1016b thereof on a side opposite thereto. In this second embodiment, the planar view of the bump electrode 1016 is an approximately round shape including the shape of an ellipse. It is to be noted here that the shape of the bump electrode 1016 is not limited to this shape and may be polygonal, such as quadrangular, instead of round. A land area 1014a, which is also used for the wiring, is formed on a side (left side in FIG. 7A) of the wiring layer 1014 opposite to the bump electrode 1016. A solder bump 1020 is placed in the land area 1014a. The solder bump 1020 is disposed on a surface of the wiring layer 1014 which is on a side thereof opposite (underside in FIG. 7A) to a side (upper side in FIG. 7A) where the bump electrode 1016 is formed.

If the thermal stress occurs due to the change in temperature in the heat treatment or usage environment, this thermal stress occurring in the bump electrode 1016 protruding in an end of the wiring layer 1014 may be concentrated on a side of the bump electrode to which the wiring layer 1014 extends. For this reason, a side surface 1016a of the bump electrode 1016 on a side to which the wiring layer 1014 extends has a milder slope than a side surface 1016b on a side opposite thereto. It is preferable that the side surface 1016a of the bump electrode 1016 on the side to which the wiring layer extends has a curvature larger than that of the side surface 1016b on the side opposite thereto. If the side surface 1016a has a curvature larger than that of the side surface 1016b, a point 1016ar lying along the side surface 1016a with height h will be contained in the range of positions where a distance Rar satisfies the following inequality. Here, as shown in FIG. 7B, the distance Rar is a distance from a head end 1016ap of the side surface 1016a to a point 1016ar, which is measured along a line in a direction perpendicular to a protruding direction of the bump electrode 1016.

$$0 \leq Rar \leq Raq \cdot (1 - h/H)$$

In the above inequality, Raq is a distance, from a head end 1016ap to a wiring layer end 1016aq of the side surface 1016a, along a line measured in a direction perpendicular to a protruding direction of the bump electrode 1016; and H is the height of the bump electrode 1016.

It is preferable that the distance Raq in a direction perpendicular to a protruding direction of the bump electrode 1016 from a head end 1016ap to a wiring layer end 1016aq thereof at the side surface 1016a on the side to which the wiring layer 1014 extends be about 1.0 to about 3.5 times greater than a distance Rbq in a direction perpendicular to a protruding direction of the bump electrode 1016 from a head end 1016bp to a wiring layer end 1016bq thereof at the side surface 1016b on the side opposite thereto.

The surface of the bump electrode 1016 may be covered with a metallic layer 1017, such as a Ni(nickel)/Au(gold) plating layer, formed by electrolytic plating or electroless plating, for example. A region to be coated in the metallic layer 1017 is part of the side surface of the bump electrode 1016 and the top surface but this should not be considered as limiting and, for example, the region to be coated may be the top surface thereof only. Note that this region to be covered is hereinafter referred to as "covering" or "coated region" also.

The semiconductor device 1050 is mounted on the device mounting board 1010 having the above-described structure so as to form the semiconductor module 1030. The semiconductor module 1030 according to the second embodiment is structured such that a bump electrode 1016 of the device mounting board 1010 is electrically connected to a device electrode 1052 of the semiconductor device 1050 through the medium of the insulating resin layer 12 interposed therebetween.

The semiconductor device 1050 has device electrodes 1052 disposed counter to the bump electrodes 1016, respectively. An element protective layer 1054, in which openings are provided so that the device electrodes 1052 can be exposed from the openings, is stacked on the main surface of the semiconductor device 1050 on the side thereof in contact with the insulating resin layer 1012. A metallic layer, such as a Ni/Au plating layer, may cover the surface of the device electrode 1052. A specific example of the semiconductor device 1050 is a semiconductor chip such as an integrated circuit (IC) or a large-scale integrated circuit (LSI). A specific example of the element protective layer 1054 is a polyimide layer. For example, aluminum (Al) is used as the device electrode 1052.

In the second embodiment, the insulating resin layer 1012 is provided between the device mounting board 1010 and the semiconductor device 1050. The device mounting board 1010 is press-bonded to one main surface S1001 of the insulating resin layer 1012 whereas the semiconductor device 1050 is press-bonded to the other main surface thereof. The bump electrode 1016, which penetrates the insulating resin layer 1012, is electrically connected to the device electrode 1052 provided on the semiconductor device 1050. A material that develops plastic flow when pressured is used for the insulating resin layer 1012. As a result, when the device mounting board 1010, the insulating resin layer 1012 and the semiconductor device 1050 are press-bonded in this order and united into one body, the probability that a residual film of insulating resin layer 1012 will stay on at an interface between the bump electrode 1016 and the device electrode 1052 is suppressed. Hence, the connection reliability is improved.

(Method for Manufacturing a Device Mounting Board and a Semiconductor Module)

FIGS. 8A to 8F are cross-sectional views showing a process in a method for forming the bump electrodes 1016.

As illustrated in FIG. 3A, a copper sheet 1013 is prepared as a metallic sheet having a thickness greater than at least the sum of the height of the bump electrode 1016 and the thickness of the wiring layer 1014.

Figure 8A:
FIGS. 8A to 8F are cross-sectional views showing a process in a method for forming bump electrodes.
Figure 8B:

Then, as shown in FIG. 8B, resists 1070 are formed selectively in alignment with a pattern of bump electrodes 1016 using a lithography method. More specifically, a resist film of predetermined film thickness is affixed to the copper sheet 1103 by a laminator unit, and it is then subjected to exposure using a photo mask having the pattern of bump electrodes 1016. After this, the resists 1070 are selectively formed on the copper sheet 1013 by a development. To improve the adhesion of the resists 1070 to the copper sheet 1013, it is desirable that a pretreatment, such as grinding, cleaning and the like, be performed as necessary on the surface of the copper sheet 1013 before the lamination of the resist film thereon.

Figure 9:
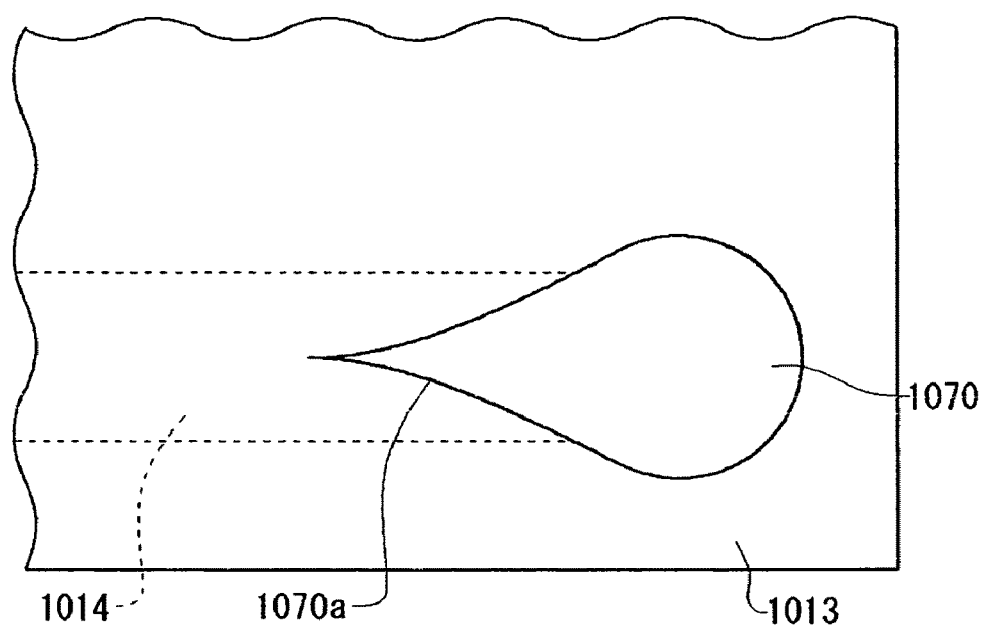
FIG. 9 is a schematic plan view of a resist.

FIG. 9 is a schematic plan view of the resist 1070. As illustrated in FIG. 9, the resist 1070 is shaped like a teardrop in a plan view, and a protrusion 1070a of the resist 1070 is disposed in such an extending direction that a wiring layer 1014 is later scheduled to be formed.

Figure 8C:
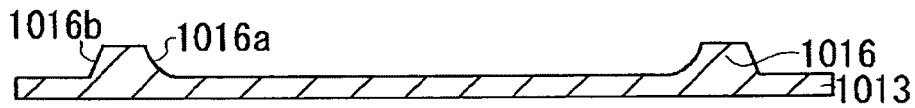

Then, as shown in FIG. 8C, bump electrodes 1016 having a predetermined pattern are formed on the copper sheet 1013 using the resist 1070 as a mask. Specifically, the bump electrodes 1016 having a predetermined pattern is formed by etching the copper sheet 1013 using the resist 1070 as a mask. The presence of the protrusion 1070a in the resist 1070 shaped like a teardrop in a plan view causes one side surface 1016a of the bump electrode 1016 to have a milder slope than the side surface 1016b thereof on the opposite side. After the formation of the bump electrode 1016, the resists 1070 are removed using a stripping agent.

Figure 8D:
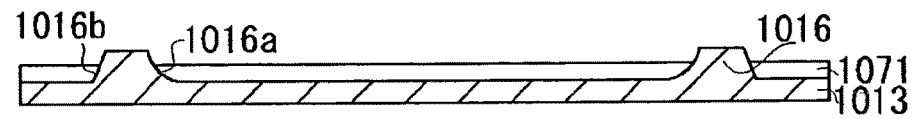

Then, as shown in FIG. 8D, a resist 1071 is stacked, on the main surface of the copper sheet 1013 which is the side having the bump electrodes 1016, to a predetermined height. The height of the resist 1071 is the height corresponding to the coated region of the metallic layer 1017.

Figure 8E:
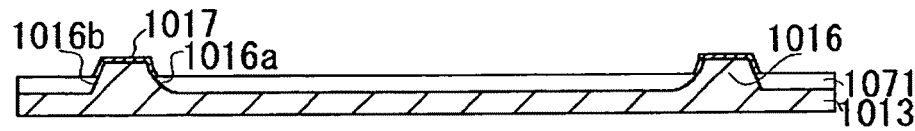

Then, as shown in FIG. 8E, the metallic layer 1017 is formed on an exposed part of the bump electrode 1016. The metallic layer 1017 is formed, as a Ni/Au plating layer, by electrolytic plating or electroless plating, for example. As the metallic layer 1017 is formed by electrolytic plating or electroless plating, the direction of crystal grains of a metal that forms the metallic layer 1017 is aligned in a vertical direction to a contact surface of the device electrode 1052. Accordingly, the pressure against the device electrode 1052 at the time when the metallic layer 1017 is press-bonded to the device electrode 1052 can be absorbed by the metallic layer 1017. As a result, the possibility of damaging the device electrodes 1052 can be reduced. A metallic layer that constitutes the metallic layer 1017 is formed so that a Ni layer lies on a side in contact with the bump electrode 1016 and an Au layer lies on a side in contact with the device electrode 1052. Note that the method for forming the metallic layer 1017 is not limited to the above-described one and, for example, it may be formed using conducive paste such as copper paste, silver paste and gold paste.

Figure 8F:
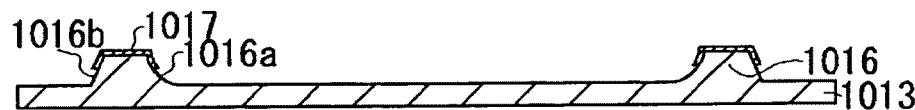

Then, as shown in FIG. 8F, the resist 1071 is removed using a stripping agent. Thus the bump electrodes 1016 are formed on the copper sheet 1013 through a process as described above. The diameter of the base, the diameter of the top, and the height of the bump electrode 16 according to the first embodiment are about 100 to about 225 µmϕ, about 60 µm, and about 40 µmϕ, respectively.

FIGS. 10A to 10F are cross-sectional views showing a process in a method for forming a wiring layer 1014 and connecting bump electrodes 1016 with device electrodes 1052.

Figure 10A:
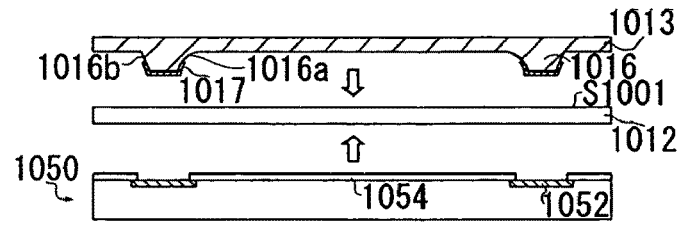
FIGS. 10A to 10F are cross-sectional views showing a process in a method for forming a wiring layer and connecting bump electrodes with device electrodes.

As shown in FIG. 10A, a copper sheet 1013 is positioned on a main surface S1001 side of the insulating resin layer 1012 such that the bump electrodes 1016 face the insulating resin layer 1012. A semiconductor device 1050 provided with the device electrodes 1052, which are located opposite to the bump electrodes 1016, is positioned on the other main surface of the insulating resin layer 1012. The thickness of the insulating resin layer 1012 is about the height of the bump electrode 1016, or approximately 40 µm. Then the copper sheet 1013 and the semiconductor device 1050 are press-bonded together with the insulating resin layer 1012 interposed therebetween, using a press machine. The pressure and temperature to be employed in the press-forming are about 5 MPa and 200° C., respectively.

Figure 10B:
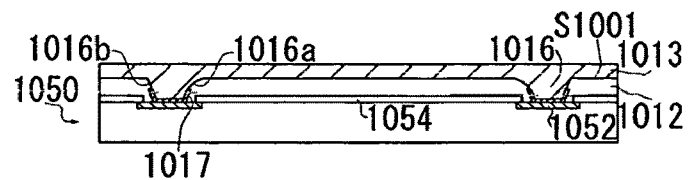

As the insulating resin layer 1012 develops a plastic flow in the press-forming, the bump electrodes 1016 penetrate the insulating resin layer 1012. Then, as shown in FIG. 10B, the copper sheet 1013, the insulating resin layer 1012, and the semiconductor device 1050 are integrated into a single block with the result that the bump electrodes 1016 and the device electrodes 1052 are press-bonded and thus electrically coupled with each other. The bump electrodes 1016 penetrate the insulating resin layer 1012 smoothly because the bump electrodes 1016 are generally shaped with the diameter being smaller toward the head thereof. In the second embodiment, by press-bonding the copper sheet 1013 to the insulating resin layer 1012, the insulating resin layer 1012 is layered on the main surface of the copper sheet 1013 where the bump electrodes 1016 are formed.

Figure 10C:
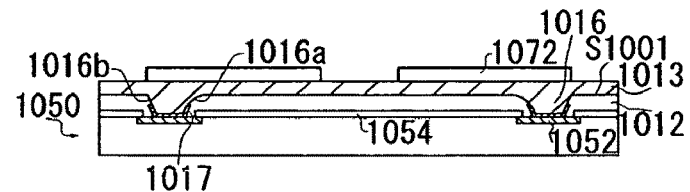

Then, as shown in FIG. 10C, resists 1072 are formed selectively in alignment with a pattern of a wiring layer 1014 on the main surface of the copper sheet 1013, which is on the side opposite to the insulating resin layer 1012, using a lithography method.

Figure 10D:
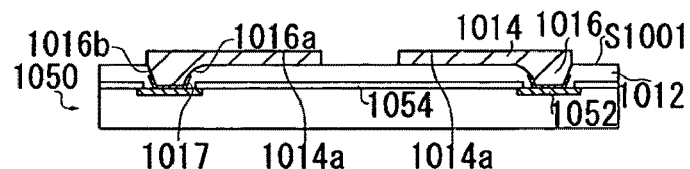

Then, as shown in FIG. 10D, the wiring layer 1014 having a predetermined pattern is formed in the copper sheet 1013 by etching the main surface of the copper sheet 1013 using the resists 1072 as a mask. After that, the resists 1072 are removed. The thickness of the wiring layer 1014 according to the second embodiment is about 20 µm.

Figure 10E:
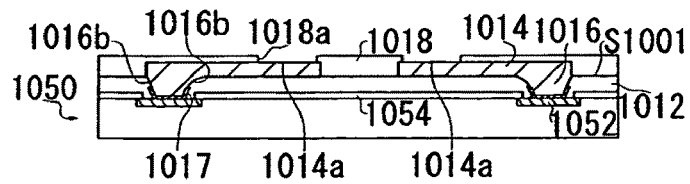

Then, as shown in FIG. 10E, a protective layer 1018, which has openings 1018a in regions corresponding to the positions for the formation of solder bumps 1020, is formed on the main surface of the wiring layer 1014, which is on the side opposite to the insulating resin layer 1012, using a lithography method.

Figure 10F:
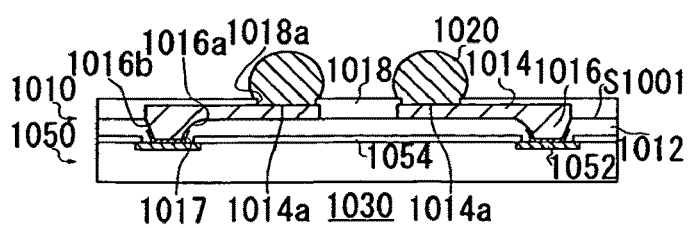

Then, as shown in FIG. 10F, the solder bumps 20 are formed within the openings 18a of the land area 1014a which is part of the wiring layer 1014.

Thus, the semiconductor module 1030 is manufactured through processes as described above. Or, where the semiconductor device 1050 is not mounted, the device mounting board 1010 is obtained.

Figure 11A:
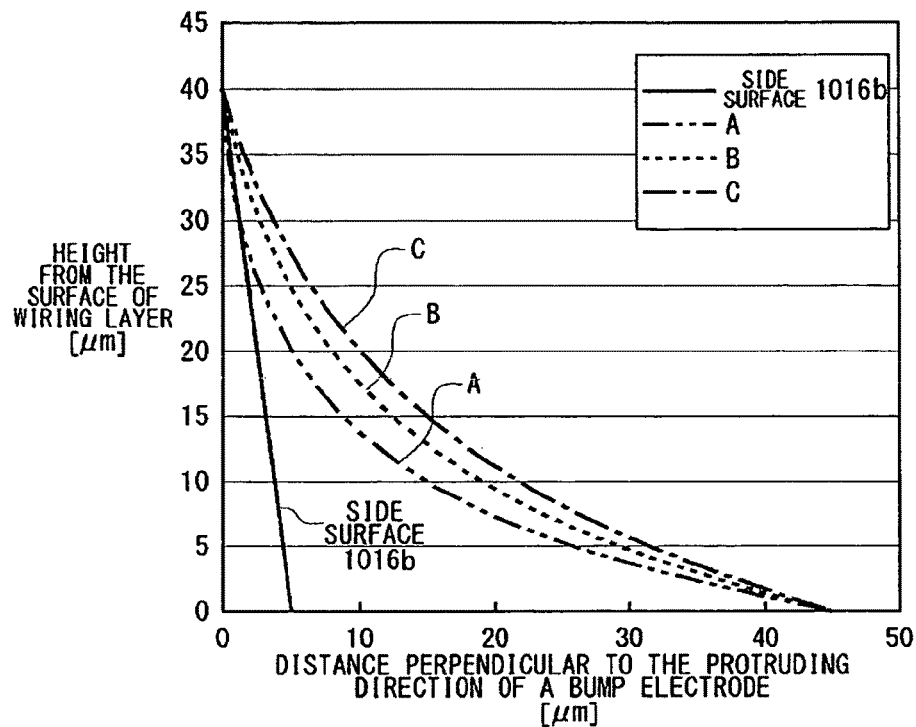
FIGS. 11A and 11B are graphs to explain a shape of side surface of a bump electrode.
Figure 11B:
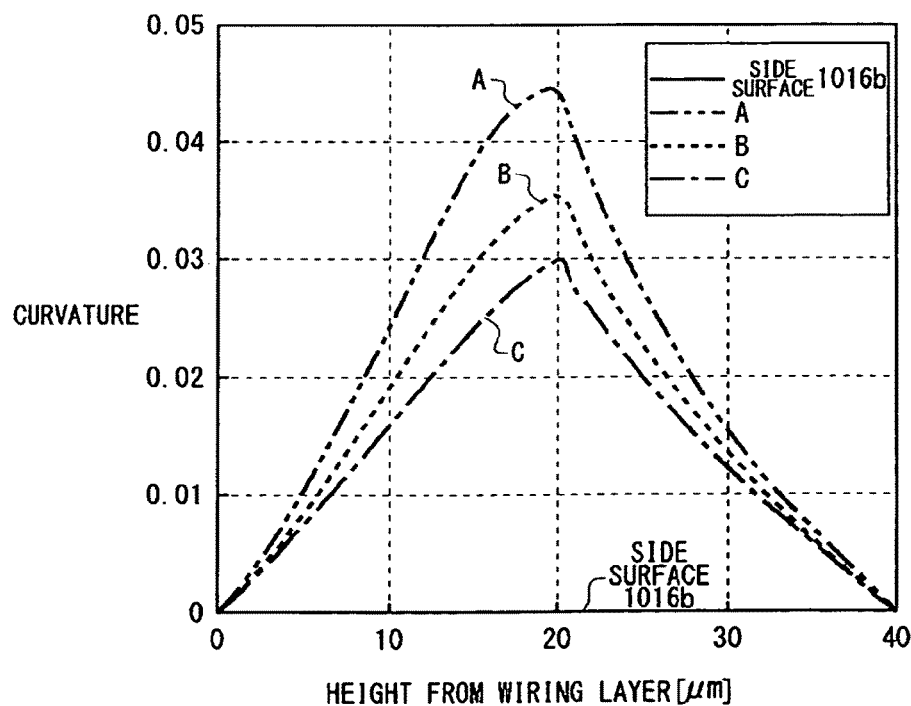

FIGS. 11A and 11B are graphs to explain a shape of the side surface 1016a of the bump electrode 1016. The vertical axis of FIG. 11A represents the height of the bump electrode 1016 measured from the surface of the wiring layer 1014 on which the bump electrode 1016 is provided, whereas the horizontal axis thereof represents the distance from the head end 1016ap in a direction perpendicular to a protruding direction of the bump electrode 1016 (the distance from the head end 1016bp as to the side surface 1016b). The vertical axis of FIG. 11B represents the curvature, whereas the horizontal axis represents the distance from the surface of the wiring layer 1014 on which the bump electrode 1016 is provided.

As shown in FIGS. 11A and 11B, the bump electrode 1016 according to the second embodiment has side surfaces 1016a of three different patterns A, B and C, for example. That is, as shown in FIG. 11A, the sizes of the side surfaces 1016a of three patterns A, B and C are such that the distance Raq, the height of h of the point 1016ar defined and the distances Rar in FIG. 7B are {45 µm} (Raq), is {20 µm} (Rar)), and {5 µm, 8 µm, 10 µm} (Rar), respectively. The height H of the bump electrode 1016 is 40 µm. The side surface 1016a of the bump electrode 1016 on the side to which the wiring layer 1014 extends has a milder slope than the side surface 1016b thereof on a side opposite thereto. As shown in FIG. 11B, the curvature of the side surface 1016a of each pattern is larger than that of the side surface 1016b opposite to the side surface 1016a. Making the slope of the side surface 1016a thereof on the side to which the wiring layer 1014 extends milder than that of the side surface 1016b thereof on the opposite side allows the dispersion of the thermal stress otherwise concentrated on the side surface 1016a. Making the curvature of the side surface 1016a larger than that of the side surface 1016b allows further dispersion of the thermal stress.

Figure 12:
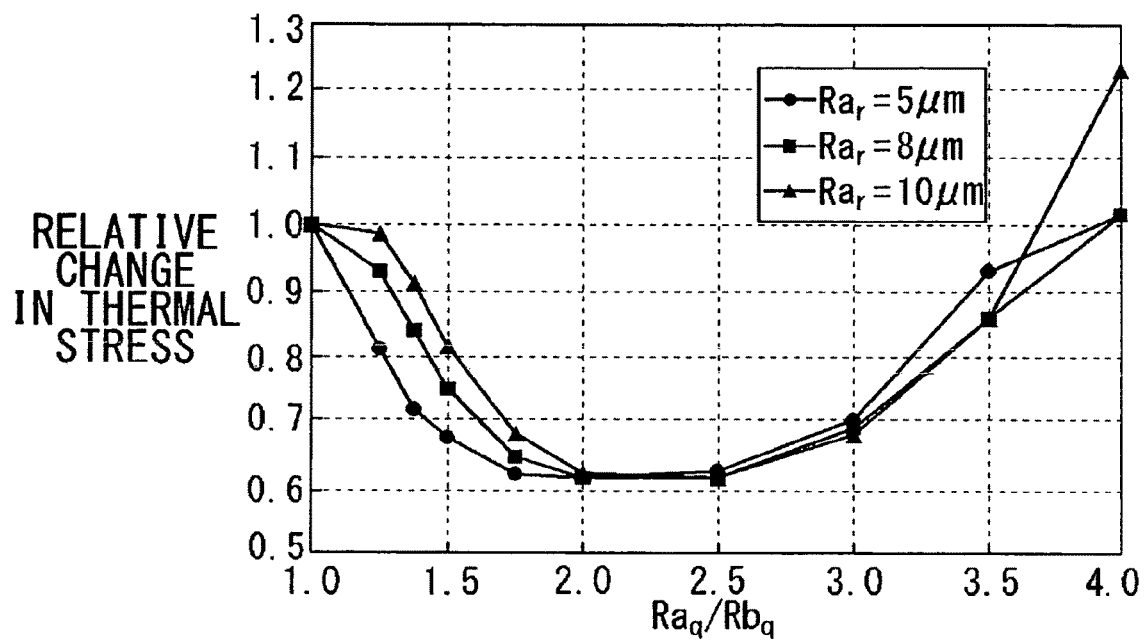
FIG. 12 is a graph showing a relationship between a shape of side surface of a bump electrode and change in thermal stress occurring in the bump electrode in an atmosphere whose temperature varies from 25° C. to 125° C.

FIG. 12 is a graph showing a relationship between the shape of the side surface 1016a of the bump electrode 1016 and change in thermal stress occurring in the bump electrode 1016 in an atmosphere whose temperature varies from 25° C. to 125° C. FIG. 12 shows a relative change in thermal stress occurring in the wiring layer end 1016aq when the distance Rar and the distance Raq as defined in FIG. 7 are varied whereas the thermal stress occurring in the wiring layer end 1016aq of the side surface 1016a, when the side surface 1016a and the side surface 1016b are of a symmetrical profile, is set to 1. The result shown in FIG. 12 is a case where the wiring layer 1014 has a structure linearly extending from a solder bump 1020 forming region to a bump electrode 1016 forming region in the wiring layer 1014 as shown in FIG. 7A. The height of the point 1016ar is set to 20 µm.

The following findings are observed from FIG. 12, That is, when, for any of the values of the distance Rar chosen from 5 µm, 8 µm and 10 µm, the distance Raq in a direction perpendicular to a protruding direction of the bump electrode 1016 from the head end 1016ap to the wiring layer end 1016aq is about 1.0 to about 3.5 times greater than the corresponding distance Rbq at the side surface 1016*b* on the opposite side, the thermal stress occurring in the wiring layer end 1016*aq* gets smaller. Hence, in this case the thermal stress occurring at the side surface 1016*a* of the bump electrode 1016 can be further reduced.

Figure 13:
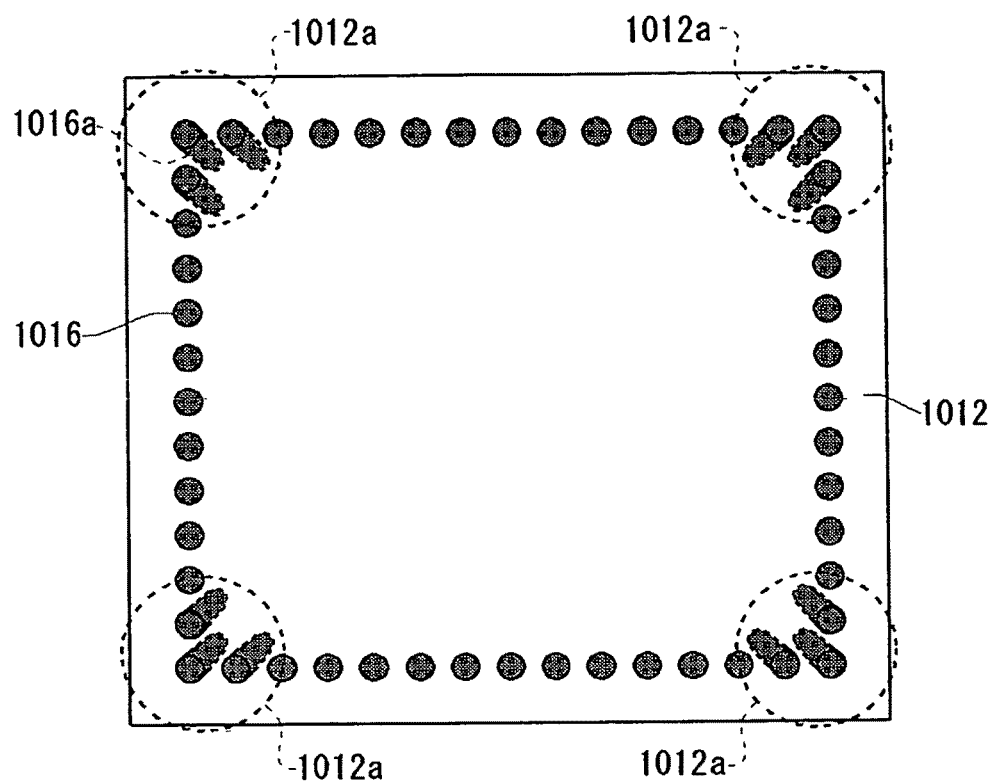
FIG. 13 is a top plan view of a device mounting board viewed from a side where a bump electrode is protruded.

FIG. 13 is a top plan view of the device mounting board 1010 viewed from a side where the bump electrode 1016 is protruded.

As shown in FIG. 13, the insulating resin layer 1012 is approximately square in shape in a plan view, and the bump electrodes 1016 are placed in a periphery of the insulating resin layer 1012. As described above, because of such a shape, thermal stress tends to be concentrated in the side surface 1016*a*, on the side to which the wiring layer 1014 extends, of the bump electrodes 1016 located in corners 1012*a* of the insulating resin layer 1012. Hence, it is preferable that a bump electrode 1016 at the shortest distance from the corner 1012*a* has such a structure as described above.

As described above, the structure of the bump electrode 1016 according to the second embodiment, the side surface 1016*a* thereof on a side to which the wiring layer 1014 extends has a milder slope than the side surface 1016*b* on the opposite side. Also, it is preferable that the curvature of the side surface 1016*a* is larger than that of the side surface 1016*b* opposite to the side surface 1016*a*. Further, it is preferably that the distance Raq in the direction perpendicular to a protruding direction of the bump electrode 1016 from the head end 1016*ap* to the wiring layer end 1016*aq* is about 1.0 to about 3.5 times greater than the corresponding distance Rbq at the side surface 1016*b* on the opposite side. Hence, the device mounting board 1010 is less likely to suffer the concentration of thermal stress in the bump electrode 1016 in situations where a semiconductor module 1030 is fabricated or mounted to a printed wiring board or where thermal stress can occur in a usage environment. In consequence, there will be less likelihood of cracking or breakage in the bump electrodes 1016, which in turn will improve the connection reliability between the device mounting board 1010 and the semiconductor device 1050. Further, when a semiconductor module 1030 is mounted on a printed wiring board, the connection reliability between the semiconductor device 1050 and the printed wiring board will be improved. Also, the reduced likelihood of breakage of bump electrodes 1016 raises the production yield of semiconductor modules, thus lowering their manufacturing costs.

Third Embodiment

Figure 14:
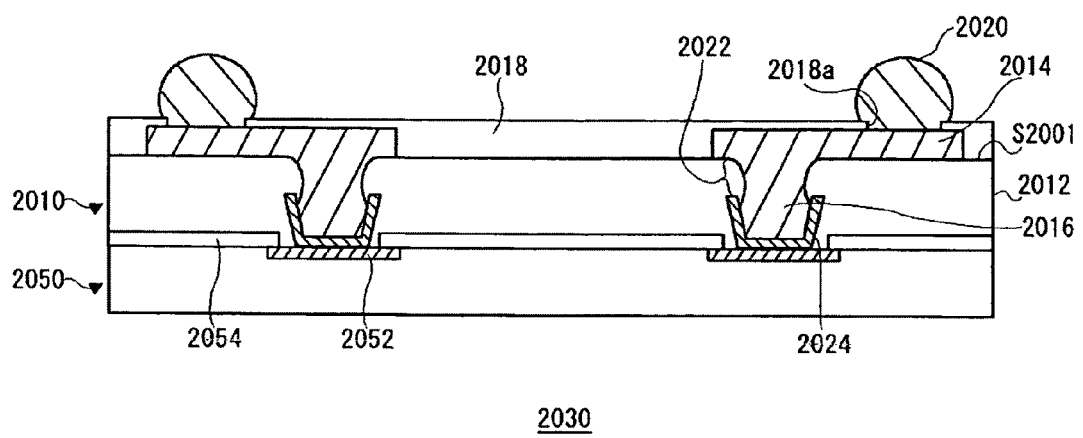
FIG. 14 is a schematic cross-sectional view illustrating a structure of a device mounting board having a bump structure according to a third embodiment of the present invention and a structure of a semiconductor module using said device mounting board.

FIG. 14 is a schematic cross-sectional view showing a structure of a device mounting board 2010 having a bump structure according to a third embodiment of the present invention and a structure of a semiconductor module 2030 using said device mounting board 2010. The semiconductor module 2030 includes a device mounting board 2010 and a semiconductor device 2050 mounted on the device mounting board 2010.

The device mounting board 2010 includes an insulating resin layer 2012, a wiring layer 2014 provided on one main surface S2001 of the insulating resin layer 2012, and a bump electrode 2016, connected electrically to the wiring layer 2014, which protrudes on a side of the insulating resin layer 2012 from the wiring layer 2014.

The insulating resin layer 2012 is made of insulating resin and is formed of, for example, a material that develops plastic flow when pressurized. An example of the material that develops plastic flow when pressurized is epoxy thermosetting resin. The epoxy thermosetting resin to be used for the insulating resin layer 2012 may be, for example, one having viscosity of 1 kPa·s under the conditions of a temperature of 160° C. and a pressure of 8 MPa. If a pressure of 5 to 15 MPa is applied to this epoxy thermosetting resin at a temperature of 160° C., then the viscosity of the resin will drop to about ⅛ of the viscosity thereof with no pressurization. In contrast to this, an epoxy resin in B stage before thermosetting has no viscosity, similarly to a case when the resin is not pressurized, under a condition that the temperature is less than or equal to a glass transition temperature Tg. And the epoxy resin develops no viscosity even when pressurized under a condition that the temperature is less than or equal to the glass transition temperature Tg.

The wiring layer 2014 is provided on one main surface S2001 of the insulating resin layer 2012 and is formed of a conducive material, preferably a rolled metal or more preferably a rolled copper. Or the wiring layer 2014 may be formed of electrolyte copper or the like. The bump electrode 2016, which is being electrically connected to the wiring layer 2014, is provided, in a protruding manner, on the insulating resin layer 2012 side of the wiring layer 2014. It is preferable that the wiring layer 2014 and the bump electrode 2016 be formed integrally with each other. Such a structure prevents the occurrence of cracks or the like due to the thermal stress at an interface between the wiring layer 2014 and the bump electrode 2016. Also, the connection between the wiring layer 2014 and the bump electrode 2016 is assured as compared when they are each a separate item. Moreover, the device electrode 2052 (described later) and the wiring layer 2014 are electrically connected simultaneously when the bump electrode 2016 and the device electrode 2052 are press-bonded and therefore another advantageous effect of not increasing the number of processes is achieved. A land area, which is also used for the wiring, is formed in a end region of the wiring layer 2014 opposite to the bump electrode 2016. A solder bump 2020 is placed in the land area 2014*a*. The solder bump 2020 is disposed on a surface of the wiring layer 2014 which is on a side thereof opposite to a side where the bump electrode 2016 is formed.

A protective layer 2018 is provided on the main surface of the wiring layer 2014 opposite to the insulating resin layer 2012. This protective layer 2018 protects the wiring layer 2014 against oxidation or the like. The protective layer 2018 may be a solder resist layer, for instance. An opening 2018*a* is formed in a predetermined position of the protective layer 2018, and the wiring layer 2014 is partially exposed there. The opening 2018*a* is formed in a predetermined region of the protective layer 2018 corresponding to the land area of the wiring layer 2014, and the land area of the wiring layer 2014 is exposed through the opening 2018*a*. A solder bump 2020, which functions as an external connection electrode, is formed within the opening 2018*a*. And the solder bump 2020 and the wiring layer 2014 are electrically connected to each other. The position in which the solder bump 2020 is formed, namely, the area in which the opening 2018*a* is formed is, for instance, a targeted position where circuit wiring is extended through a rewiring.

Figure 15:
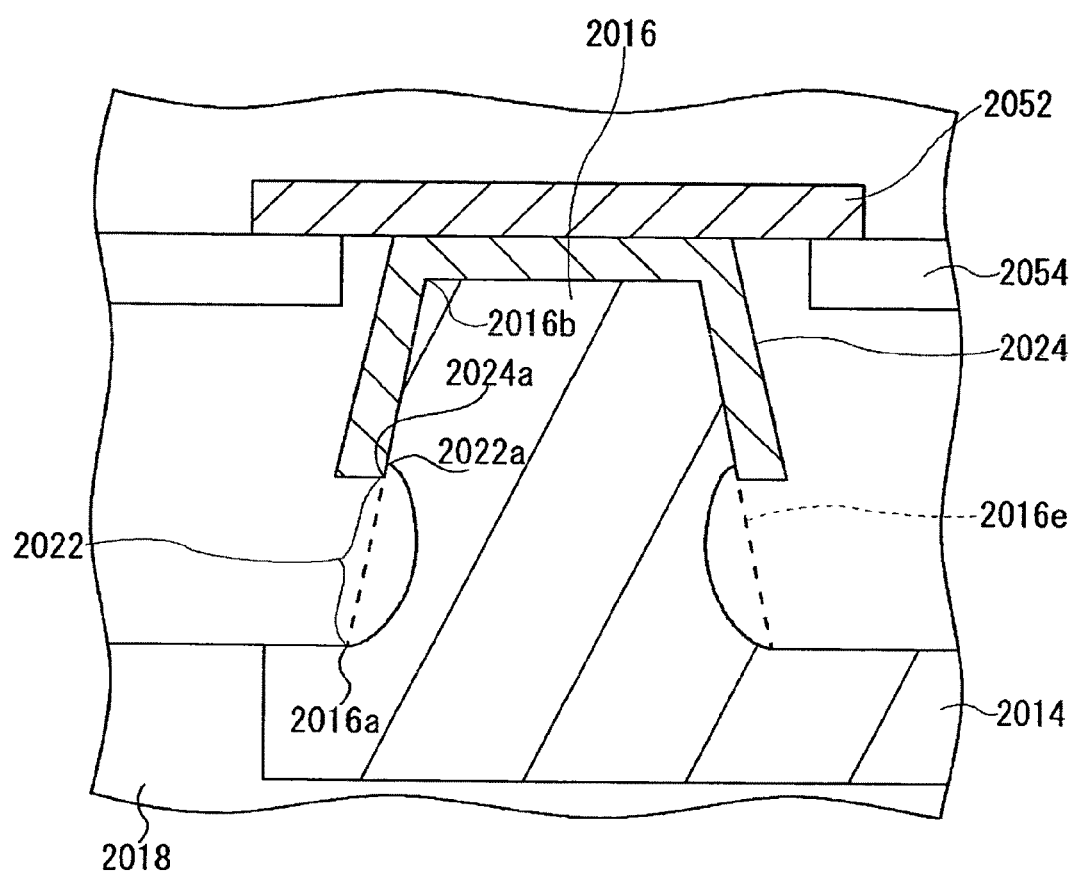
FIG. 15 is a schematic view showing a partially expanded cross section of the vicinity of a bump electrode shown in FIG. 14.

FIG. 15 is a schematic view showing a partially expanded cross section of the vicinity of a bump electrode 2016 shown in FIG. 14.

As illustrated in FIG. 15, the bump electrode 2016 has a constricted portion 2022 provided in the side surface thereof in a predetermined region. In the third embodiment, the constricted portion 2022 is provided in an region covering the range from a wiring layer end 2016*a* of the bump electrode 2016 to a predetermined height in a protruding direction of the bump electrode 2016 (upward in FIG. 15). The predetermined height in a protruding direction of the bump electrode 2016, where the constricted portion 2022 is provided, is, for example, about ¼ to ¾ of the total height of the bump electrode 2016. A side surface of the constricted portion 2020 in the bump electrode 2016 is curved toward the center axis of the bump electrode 2016 as compared with a side surface of its neighboring region, and the diameter of the constricted portion 2020 is narrower than that of the neighboring region in the bump electrode 2016. Note that the side surface of the bump electrode 2016 includes the constricted portion 2022 and its neighboring region.

In other words, on the side surface of the bump electrode 2016, the curvature thereof differs greatly between a wiring layer side and a tip side at an end 2022a of the constricted portion 2022 on a bump electrode head side. For example, the curvature of the side surface on a wiring layer side becomes drastically large as compared with that of the side surface on a tip side adjacent to the end 2022a. The side surface of the bump electrode 2016 is formed in such a manner that the diameter of the bump electrode 2016 is narrower toward the head thereof. And the side surface of the constricted portion 2022 is positioned toward the center axis of the bump electrode 2016, in a much inwardly manner, with respect to an extrapolation line 2016e, extending toward the wiring layer side, along the side surface on the tip side. The constricted portion 2022 may be provided circumferentially across the entire bump electrode 2016 or provided circumferentially in a predetermined region of the bump electrode 2016. The planar view of the bump electrode 2016 is an approximately round shape including the shape of an ellipse. However, the shape of the bump electrode 2016 is not limited to this shape and may be polygonal, such as quadrangular. In the device mounting board 2010, the insulating resin layer 2012 fills the constricted portion 2022, so that there results an improved adhesion between the constricted portion 2022 and the insulating resin layer 2012 due to the anchor effect of the constricted portion 2022.

The bump electrode 2016 is provided with a metallic layer 2024 which covers the head surface of the bump electrode 2016 and the side surface thereof from the head end 2016b to a predetermined height in the protruding direction thereof. The metallic layer 2024 may be, for example, a Ni(nickel)/Au(gold) plating layer and a Ni/Au/Sn (tin) plating layer. The metallic layer 2024 may be a conductive paste layer. The metallic layer 2024 may be single-layered or multilayered. In the third embodiment, the area of the metallic layer 2024 covering the side surface of the bump electrode 2016 corresponds to the region where the constricted portion 2022 is not provided. That is, in the third embodiment, the position of an end 2024a of the metallic layer 2024 on the wiring layer side approximately agrees with the position of an end 2022a of the constricted portion 2022 on the bump electrode head side.

The surface of the constricted portion 2022 is provided with fine asperities, and the surface roughness of the constricted portion 2022 may be greater than that of the top surface of the bump electrode 2016. The asperities provided on the surface of the constricted portion 2022 improves the adhesion between the bump electrode 2016 and the insulating resin layer 2012 due to the anchor effect of the fine asperities. The degree to which a desired anchor effect is achieved can be determined by conducting experiments, and may be 1.5 to 3 µm, for instance.

The semiconductor device 2050 is mounted on the device mounting board 2010 having the above-described structure so as to form the semiconductor module 2030. The semiconductor module 2030 according to the third embodiment is structured such that the bump electrode 2016 of the device mounting board 2010 is electrically connected to the device electrode 2052 of the semiconductor device 2050 through the medium of the insulating resin layer 2012 interposed therebetween.

The semiconductor device 2050 has device electrodes 2052 disposed counter to the bump electrodes 2016, respectively. An element protective layer 2054, in which openings are provided so that the device electrodes 2052 can be exposed from the openings, is stacked on the main surface of the semiconductor device 2050 on the side thereof in contact with the insulating resin layer 2012. A metallic layer, such as a Ni/Au plating layer, may cover the surface of the device electrode 2052. A specific example of the semiconductor device 2050 is a semiconductor chip such as an integrated circuit (IC) or a large-scale integrated circuit (LSI). A specific example of the element protective layer 2054 is a polyimide layer. For example, aluminum (Al) is used as the device electrode 2052.

In the third embodiment, the insulating resin layer 2012 is provided between the device mounting board 2010 and the semiconductor device 2050. The device mounting board 2010 is press-bonded to one main surface S2001 of the insulating resin layer 2012 whereas the semiconductor device 2050 is press-bonded to the other main surface thereof. The bump electrode 2016, which penetrates the insulating resin layer 2012, is electrically connected to the device electrode 2052 provided on the semiconductor device 2050. A material that develops plastic flow when pressured is used for the insulating resin layer 2012. As a result, when the device mounting board 2010, the insulating resin layer 2012 and the semiconductor device 2050 are press-bonded in this order and united into one body, the probability that a residual film of insulating resin layer 2012 will stay on at an interface between the bump electrode 2016 and the device electrode 2052 is suppressed. Hence, the connection reliability is improved. If the surface of the device electrode 2052 are covered with, for example, a Ni/Au plating layer, the bump electrode 2016 and the device electrode 2052 will be bonded to each other on the golds disposed on their respective outermost surfaces (Au—Au bonding). Hence, the connection reliability between the bump electrode 2016 and the device electrode 2052 is further improved.

(Method for Manufacturing a Device Mounting Board and a Semiconductor Module)

FIGS. 16A to 16G are cross-sectional views-showing a process in a method for forming the bump electrodes 2016 and the constricted portions 2022.

Figure 16A:
FIGS. 16A to 16G are cross-sectional views showing a process in a method for forming bump electrodes and constricted portions.

As illustrated in FIG. 16A, a copper sheet 2013 is prepared as a metallic sheet having a thickness greater than at least the sum of the height of the bump electrode 2016 and the thickness of the wiring layer 2014.

Figure 16B:

Then, as shown in FIG. 16B, resists 2071 are formed selectively in alignment with a pattern of bump electrodes 2016 using a lithography method. More specifically, a resist film of predetermined film thickness is affixed to the copper sheet 2013 by a laminator unit, and it is then subjected to exposure using a photo mask having the pattern of bump electrodes 2016. After this, the resists 2071 are selectively formed on the copper sheet 2013 by a development. To improve the adhesion of the resists 2071 to the copper sheet 2013, it is desirable that a pretreatment, such as grinding, cleaning and the like, be performed as necessary on the surface of the copper sheet 2013 before the lamination of the resist film thereon.

Figure 16C:
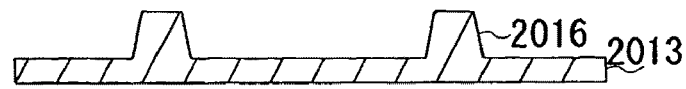

Then, as shown in FIG. 16C, bump electrodes 2016 having a predetermined pattern are formed on the copper sheet 2013 using the resist 2071 as a mask. Specifically, the bump electrodes 2016 having a predetermined pattern is formed by etching the copper sheet 2013 using the resist 2071 as a mask. After the formation of the bump electrode 2016, the resists 2071 are removed using a stripping agent.

Figure 16D:
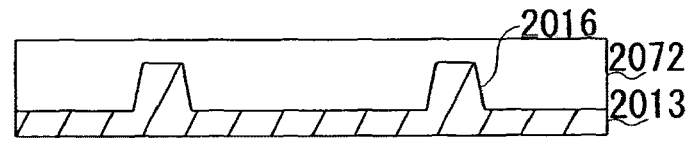

Then, as shown in FIG. 16D, a resist 2072 having a plating resistance is stacked to a predetermined height on one main surface of the copper sheet 2013 which is the side having the bump electrodes 2016. The height of the resist 2072 is such that it is above or equal to the end 2024a of a metallic layer 2024 on the wiring layer side.

Figure 16E:
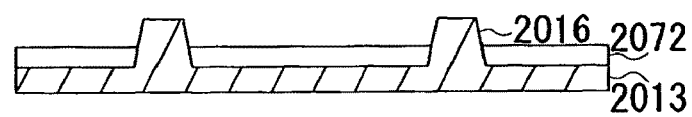

Then, as shown in FIG. 16E, the heads of the bump electrodes 2016 are exposed to a predetermined extent by removing a predetermined amount of the resist 2072 by performing an ashing using $O_2$ plasma or the like or a predetermined chemical treatment, as necessary, on the main surface of the resist 2072. Note that the height of the bump electrode 2016 exposed and protruded from the resist 2072 is equal to the height of the region to be coated by a metallic layer 2024.

Figure 16F:
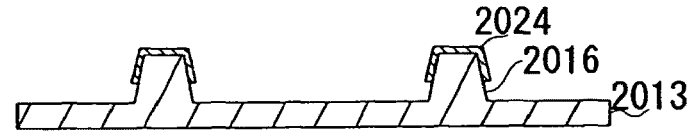

Then, as shown in FIG. 16F, a metallic layer 2024 is formed on the exposed part of the bump electrode 2016. The metallic layer 2024 is formed, as a Ni/Au plating layer, by electrolytic plating or electroless plating, for example. When the metallic layer 2024 is formed by electrolytic plating or electroless plating, the direction of crystal grains of a metal that forms the metallic layer 2024 is aligned in a vertical direction to a contact surface of the device electrode 2052. Accordingly, the pressure against the device electrode 2052 at the time when the metallic layer 2024 is press-bonded to the device electrode 2052 can be absorbed by the metallic layer 2024. As a result, the possibility of damaging the device electrodes 2052 can be reduced. A metallic layer that constitutes the metallic layer 2024 is formed so that a Ni layer lies on a side in contact with the bump electrode 2016 and an Au layer lies on a side in contact with the device electrode 2052. Note that the method for forming the metallic layer 2024 is not limited to the above-described one and, for example, it may be formed using conducive paste such as copper paste, silver paste and gold paste. After the formation of the metallic layer 2024, the resist 2072 is removed using a stripping agent.

Figure 16G:
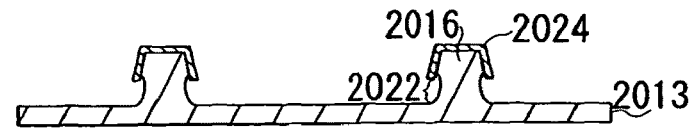

Then, as shown in FIG. 16G, a constricted portion 2022 is formed in the region of the bump electrode 2016 not coated with the metallic layer 2024, by etching the copper sheet 2013 using the metallic layer 2024 as a mask. Since the metallic layer 2024 is used as a mask, a need to add a masking process for forming the constricted portions 2022 is eliminated and therefore the increase in the number of processes can be suppressed. In conjunction with the formation of the constricted portions 2022, the roughening treatment may be performed on the surface of the bump electrodes 2016 to form the asperities on the constricted portions 2022 in such a manner that the surface roughness of the constricted portions 2022 is greater than that of the top surface of the bump electrodes 2016. The roughening treatment may be, for example, a chemical treatment, such as a CZ treatment (registered trademark), or a plasma treatment.

The bump electrodes 2016 are formed on the copper sheet 2013 through a process as described above. The diameter of the base, the diameter of the top, and the height of the bump electrode 2016 according to the third embodiment are about 40 µmφ, about 30 µmφ, and about 40 µmφ, respectively. The thickness of the metallic layer 2024 is about 5 µmφ, for example, and the depth of the constricted portion 2022 is about 5 µmφ, for example.

FIGS. 17A to 17E are cross-sectional views showing a process in a method for forming a wiring layer 2014 and connecting bump electrodes 2016 with device electrodes 2052.

Figure 17A:
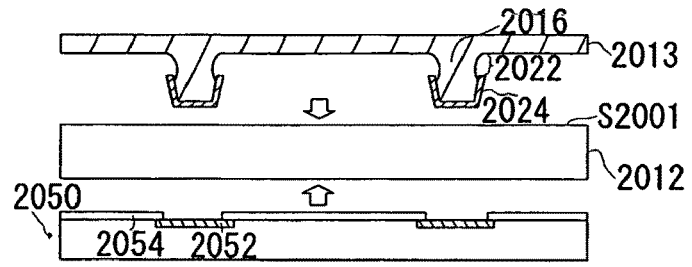
FIGS. 17A to 17E are cross-sectional views showing a process in a method for forming a wiring layer and connecting bump electrodes with device electrodes.

As shown in FIG. 17A, a copper sheet 2013 is positioned on a main surface S2001 side of the insulating resin layer 2012 such that the bump electrodes 2016 face the insulating resin layer 2012. A semiconductor device 2050 provided with the device electrodes 2052, which are located opposite to the bump electrodes 2016, is positioned on the other main surface of the insulating resin layer 2012. The thickness of the insulating resin layer 2012 is about the sum of the height of the bump electrode 2016 and the thickness of the metallic layer 2024, or approximately 45 µm. Then the copper sheet 2013 and the semiconductor device 2050 are press-bonded together with the insulating resin layer 2012 interposed therebetween, using a press machine. The pressure and temperature to be employed in the press-forming are about 5 MPa and 200° C., respectively.

Figure 17B:
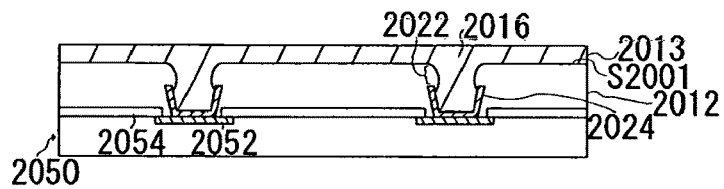

As the insulating resin layer 2012 develops a plastic flow in the press-forming, the bump electrodes 2016 penetrate the insulating resin layer 2012. Then, as shown in FIG. 17B, the copper sheet 2013, the insulating resin layer 2012 and the semiconductor device 2050 are integrated into a single block with the result that the bump electrodes 2016 and the device electrodes 2052 are press-bonded and thus electrically coupled with each other. The bump electrodes 2016 penetrate the insulating resin layer 2012 smoothly because the bump electrodes 2016 excluding the constricted portion 2022 thereof are shaped with the diameter being smaller toward the head thereof. In the third embodiment, by press-bonding the copper sheet 2013 to the insulating resin layer 2012, the insulating resin layer 2012 is layered on the main surface of the copper sheet 2013 where the bump electrodes 16 are formed.

Figure 17C:
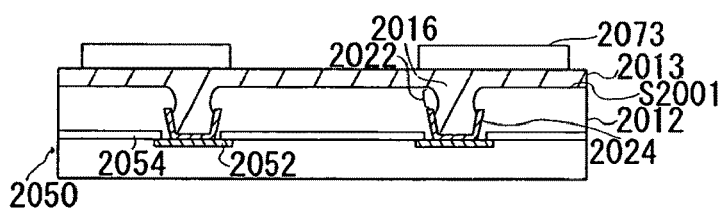

Then, as shown in FIG. 17C, resists 2073 are formed selectively in alignment with a pattern of a wiring layer 2014 on the main surface of the copper sheet 2013, which is on the side opposite to the insulating resin layer 2012, using a lithography method.

Figure 17D:
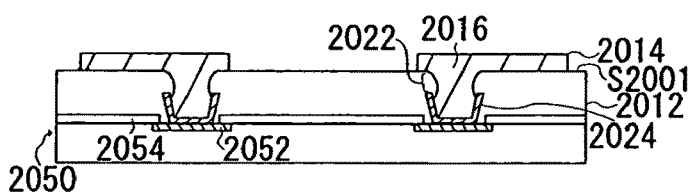

Then, as shown in FIG. 17D, the wiring layer 2014 having a predetermined pattern is formed in the copper sheet 2013 by etching the main surface of the copper sheet 2013 using the resists 2073 as a mask. After that, the resists 2073 are removed. The thickness of the wiring layer 2014 according to the third embodiment is about 15 µm.

Figure 17E:
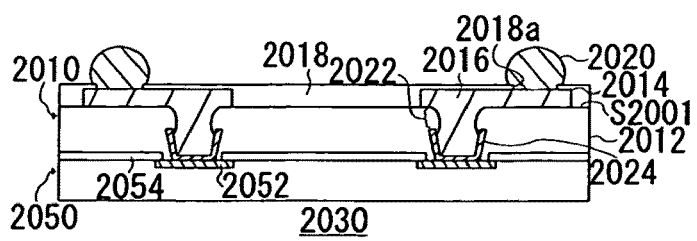

Then, as shown in FIG. 17E, a protective layer 2018, which has openings 2018a in regions corresponding to the positions for the formation of solder bumps 2020, is formed on the main surface of the wiring layer 2014, which is on the side opposite to the insulating resin layer 2012, using a lithography method. Then the solder bumps 2020 are formed within the openings 2018a.

Thus, the semiconductor module 2030 is manufactured through processes as described above. Or, where the semiconductor device 2050 is not mounted, the device mounting board 2010 is obtained.

FIGS. 18A to 18D are schematic diagrams showing results, calculated through simulation, of a relationship between an area of the constricted portion 2022 and a change in thermal stress occurring in an ambience where the temperature is changed from 25° C. to 125° C. FIG. 19A to FIG. 19C are schematic diagrams showing results, calculated through simulation, of a relationship between areas of the constricted portion 2022 and the metallic layer 2024 and a change in thermal stress occurring in an ambience where the temperature is changed from 25° C. to 125° C. FIG. 18D shows a conventional structure where the constricted portion 2022 is not provided. FIGS. 18A, 18B and 18C show structures where the heights h2001, h2002 and h2003 of the ends 2022a of the constricted portions 2022 are ¾, ½ and ¼ of the total height of the bump electrode 2016, namely 30 µm, 20 µm and 10 µm, respectively. FIGS. 19A, 19B and 19C show structures where the heights h2001, h2002 and h2003 of the ends 2022a of the constricted portions 2022 and ends 2024a of the metallic layers 2024 are ¾, ½ and ¼ of the total height of the bump electrode 2016, namely 30 µm, 20 µm and 10 µm, respectively. The device electrodes 2052 are omitted in FIGS. 18A to 19C.

As shown in FIG. 18D, when a constricted portion 2022 is not provided (namely, for the bump electrode not provided with the constricted portion 2022), there is a concentration of thermal stress in the neighborhood where the bump electrode 2016 (metallic layer 2024) and the semiconductor device 2050 (device electrode 2052) are connected to each other. There is also a concentration of thermal stress even within the semiconductor device 2050. On the other hand, as shown in FIGS. 18A to 18C, when the constricted portion 2022 is provided (the bump electrode is provided with the constricted portion 2022), the concentration of thermal stress seen in the neighborhood where the bump electrode 2016 (metallic layer 2024) and the semiconductor device 2050 (device electrode 2052) are connected to each other shifts into the bump electrode 2016. Thus there is no longer the concentration of thermal stress within the semiconductor device 2050. This means that the constricted portion 2022, if provided, can shift the region of concentrated thermal stress due to temperature change from the neighborhood where the bump electrode 2016 (metallic layer 2024) and the semiconductor device 2050 (device electrode 2052) are connected to each other to the inside of the bump electrode 2016. As a result, the thermal stress, which occurs in the neighborhood where the bump electrode 2016 (metallic layer 2024) and the semiconductor device 2050 (device electrode 2052) are connected to each other, gets dispersed, thereby reducing the maximum stress working there.

Comparison of A against A, B against B, and C against C of FIGS. 18A to 18D and FIGS. 19A to 19C allows the following observations. That is, provision of a metallic layer 2024 covering a predetermined area of the side surface of the bump electrode 2016, in addition to the provision of the constricted portion 2022, further promotes the shift of the concentration of thermal stress seen in the neighborhood where the bump electrode 2016 (metallic layer 2024) and the semiconductor device 2050 (device electrode 2052) are connected to each other to the inside of the bump electrode 2016. As a result, the thermal stress, which occurs in the neighborhood where the bump electrode 2016 (metallic layer 2024) and the semiconductor device 2050 (device electrode 2052) are connected to each other, gets further dispersed, thereby further reducing the maximum stress working there.

The following is a summary of advantageous effects of implementing a structure as described above. The bump electrode 2016 according to the present embodiment is provided with a constricted portion 2022 in a predetermined area of the side surface in the protruding direction thereof. Hence, it is possible to alleviate the concentration of thermal stress in the neighborhood where the bump electrode 2016 and the device electrode 2052 are connected to each other, in situations where a semiconductor module 2030 is fabricated or mounted to a printed wiring board or where thermal stress can occur in a usage environment. Also, the bump electrode 2016 is provided with a metallic layer 2024 which covers the head surface thereof and the side surface thereof from the head end 2016b to a predetermined height in the protruding direction thereof. This further helps to alleviate the concentration of thermal stress in the neighborhood where the bump electrode 2016 and the device electrode 2052 are connected to each other. And, because of the alleviated concentration of thermal stress in the neighborhood where the bump electrode 2016 and the device electrode 2052, there will be less likelihood of the device electrode 2052 suffering damage when the semiconductor device 2050 is mounted on the device mounting board 2010. This will improve the connection reliability between the bump electrode 2016 and the device electrode 2052. As a result, when a semiconductor module 2030 is mounted on a printed wiring board, the connection reliability between the semiconductor device 2050 and the printed wiring board is improved. Also, the reduced likelihood of breakage of the semiconductor device 2050 raises the production yield of semiconductor modules 2030, thus lowering their manufacturing costs.

With the bump electrode 2016 penetrating the insulating resin layer 2012, the insulating resin layer 2012 fills the constricted portion 2022, so that there results close adhesion between the constricted portion 2022 and the insulating resin layer 2012 due to the anchor effect of the constricted portion 2022. This improves the adhesion between the bump electrode 2016 and the insulating resin layer 2012. Moreover, if the surface of the constricted portion 2022 is provided with fine asperities, then the adhesion between the bump electrode 2016 and the insulating resin layer 2012 is further improved due to the anchor effect of the fine asperities. The improved adhesion between the bump electrode 2016 and the insulating resin layer 2012 helps prevent their separation from each other even at the occurrence of thermal stress in situations where a semiconductor module 2030 is fabricated or is mounted on a printed wiring board or where thermal stress is caused by temperature change in a usage environment and the like. As a result, when the semiconductor device 2050 is mounted on the device mounting board 2010, there will be less likelihood of disconnection between the bump electrode 2016 and the device electrode 2052, which in turn will improve the connection reliability between the bump electrode 2016 and the device electrode 2052.

Fourth Embodiment

In the above-described third embodiment, the semiconductor module 2030 is formed in such a manner that the copper sheet 2013 and the semiconductor device 2050 are press-formed with the insulating resin layer 2012 held between the copper sheet 2013 and the semiconductor device 2050. The semiconductor device 2030 may be formed as follows. A description is hereinbelow given of a fourth embodiment. Note that the method for manufacturing the bump electrodes 2016 and metallic layers 2024 is basically the same as those employed in the first embodiment. And the same components as those of the third embodiment are given the same reference numerals and the explanation thereof is omitted as appropriate.

FIGS. 20A to 20D are cross-sectional views showing a process in a method, for connecting bump electrodes 2016 with device electrodes 2052.

Figure 20A:
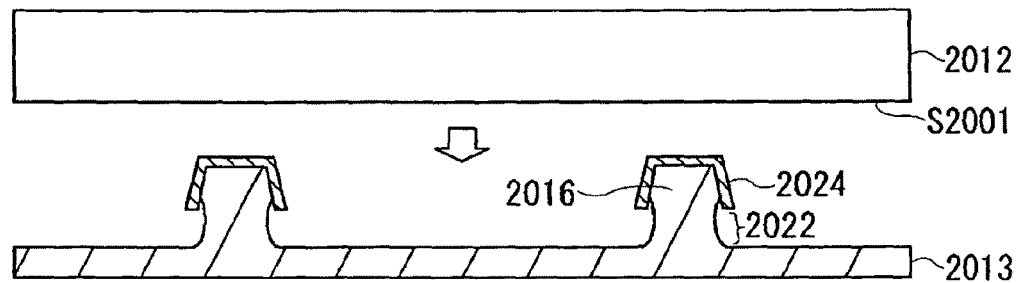
FIGS. 20A to 20D are cross-sectional views showing a process in a method, for connecting bump electrodes with device electrodes, according to a fourth embodiment of the present invention.

As shown in FIG. 20A, similar to the method employed in the third embodiment, a copper sheet 2013 where the bump electrodes 2016 and the metallic layers 2024 are formed is positioned on a main surface S2001 side of the insulating resin layer 2012 such that the bump electrodes 2016 face the insulating resin layer 2012.

Figure 20B:
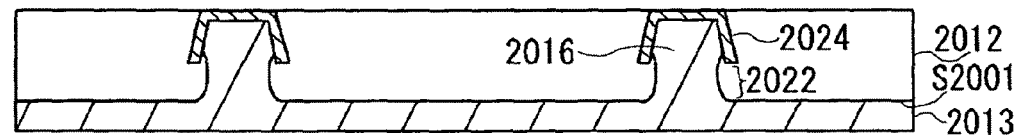

Then, as shown in FIG. 20B, the insulating resin layer 2012 is stacked on the main surface of the copper sheet 2013 which is the side having the protruding bump electrodes 2016. The metallic layer 2024 is exposed by removing the main surface of the insulating resin layer 2012 by etching as necessary. As a result, the bump electrode 2016 penetrates the insulting resin layer 2012.

Figure 20C:
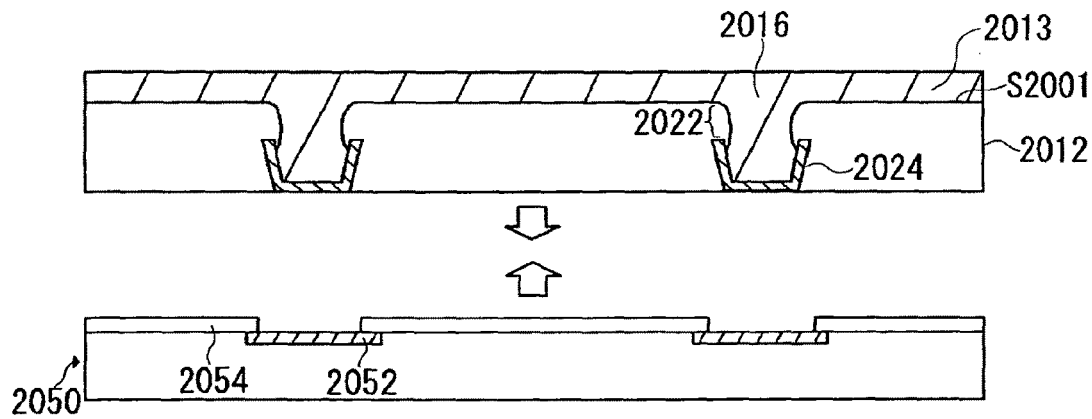
Figure 20D:
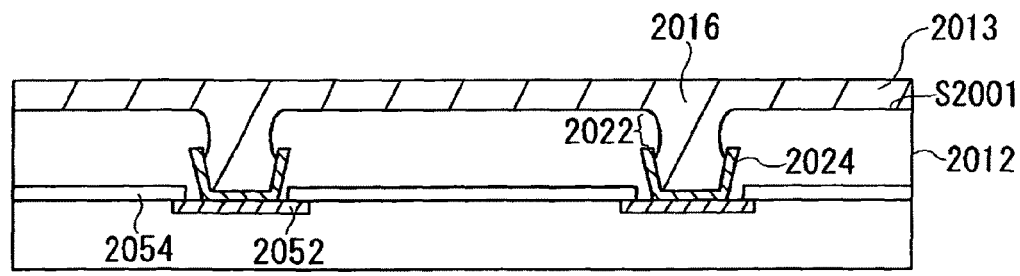

Next, as shown in FIG. 20C, the copper sheet 2013, stacked on the insulating resin layer 2012, and the semiconductor device 2050 are positioned so that the bump electrode 2016 and the device electrode 2052 are disposed counter to each other. Then, the copper sheet 1013 and the semiconductor device 2050 are press-bonded together by the use of a press machine. As a result, as shown in FIG. 20D, the copper sheet 2013, the insulating resin layer 2012 and the semiconductor device 2050 are integrated into a single block with the result that the bump electrodes 2016 and the device electrodes 2052 are press-bonded and thus electrically coupled with each other.

Then, using the similar method employed in the third embodiment, a wiring layer 2014, a protective layer 2018 and a solder bump 2020 are formed so as to complete the semiconductor module 2030.

According to the fourth embodiment, therefore, the following advantageous effects are achieved in addition to the aforementioned advantages of the third embodiment. That is, in this fourth embodiment, the metallic layer 2024 is exposed from the insulating resin layer 2012, so that the copper sheet 2013 and the semiconductor 2050 can be accurately positioned when they are press-bonded. Accordingly, the connection reliability between the bump electrode 2016 and the device electrode 2052 is further improved and thereby the connection reliability between the device mounting board 2010 and the semiconductor device 2050 is further improved.

Fifth Embodiment

In the above-described third and fourth embodiments, the constricted portion 2022 is formed by etching the copper sheet 2013 using the metallic layer 2024 as the mask. The constricted portion 2022 may be formed as follows. A description is hereinbelow given of a fifth embodiment. The same components as those of the third embodiment are given the same reference numerals and the explanation thereof is omitted as appropriate.

FIGS. 21A to 21G are cross-sectional views showing a process in a method, for forming a constricted portion 2022.

Figure 21A:
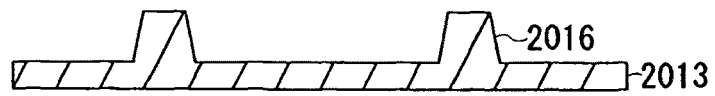
FIGS. 21A to 21G are cross-sectional views showing a process in a method, for forming a constricted portion, according to a fifth embodiment of the present invention.

As shown in FIG. 21A, a copper sheet 2013 with bump electrodes 2016 formed thereon by the same method as in the third embodiment is prepared.

Figure 21B:

Then, as shown in FIG. 21B, a resist 2074 having a plating resistance is stacked to a predetermined height on one main surface of the copper sheet 2013 which is the side having the bump electrodes 2016. The height of the resist 2074 is such that it is above or equal to an end 2024a of a metallic layer 2024 on the wiring layer side. In the fifth embodiment, the head surface only of the bump electrode 2016 is coated with the metallic layer 2024, so that the resist 2074 is stacked to completely cover the bump electrodes 2016.

Figure 21C:

Then, as shown in FIG. 21C, the heads of the bump electrodes 2016 are exposed to a predetermined extent by removing a predetermined amount of the resist 2074 by performing an ashing using $O_2$ plasma or the like or a predetermined chemical treatment, as necessary, on the main surface of the resist 2074. Note that the height of the bump electrode 2016 exposed and protruded from the resist 2074 is equal to the height of the region to be coated by a metallic layer 2024. Note also that in the fifth embodiment, the head surface only of the bump electrode 2016 is exposed.

Figure 21D:
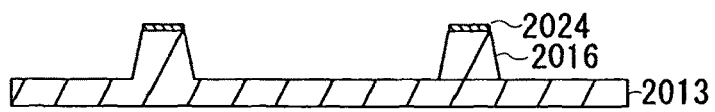

Then, as shown in FIG. 21D, a metallic layer 2024 is formed on the exposed part of the bump electrode 2016. In the fifth embodiment, the metallic layer 2024 is formed on the head surface of the bump electrode 2016. After the formation of the metallic layer 2024, the resist 2074 is removed using a stripping agent.

Figure 21E:
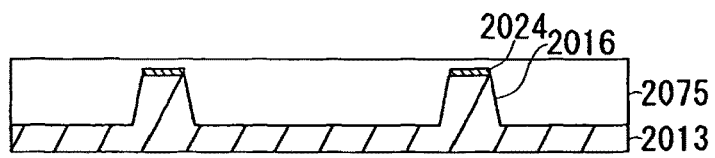

Then, as shown in FIG. 21E, a resist 2075 is stacked on the main surface of the copper sheet 2013 having the bump electrodes 2016 in such a manner that the bump electrode 2016 and the metallic layer 2024 are completely buried.

Figure 21F:
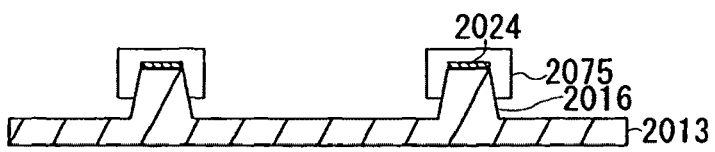

Then, as shown in FIG. 21F, the resist 2075 is selectively removed, using a photolithography method, so that a constricted portion forming region of the bump electrode 2016 is exposed.

Figure 21G:
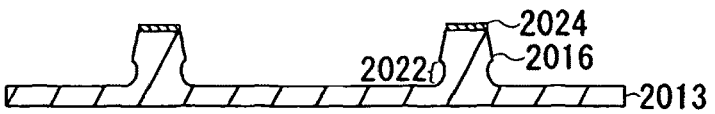

Then, as shown in FIG. 21G, a constricted portion 2022 is formed in the region of the bump electrode 2016 not coated with the resist 2075, by etching the copper sheet 2013 using the resist 2075 as a mask. Since the constricted portion 2022 is formed by an etching using the resist 2075, instead of the metal layer 2024, as the mask, there is a disagreement between the position of the end 2022a of the constricted portion 2022 on the bump electrode head side and the position of the end 2024a of the metallic layer 2024 on the wiring layer side. Or the arrangement may be such that, as in the third embodiment, the metallic layer 2024 is provided on the head surface and part of the side surface of the bump electrode 2016 and in addition the resist 2075 is so formed as to cover the metallic layer 2024 and an etching is done using the resist 2075 as the mask, so that there may be an agreement between the position of the end 2024a of the metal layer 2024 on the wiring layer side and the position of the end 2022a of the constricted portion 2022 on the bump electrode head side. When there is an agreement in position between the end 2024a of the metallic layer 2024 and the end 2022a of the constricted portion 2022, it is possible to increase the size of constriction in the bump electrode 2016 because of the continuity between the end of the constricted portion 2022 and the surface on the wiring layer side of the metal layer 2024.

Through processes as described above, the constricted portion 2022 is formed in the bump electrode 2016. The copper sheet 2013 having bump electrodes 2016 with a constricted portion 2022 thus formed can be connected to device electrodes 2052 to construct a semiconductor module 2030 in the same way as in the third or the fourth embodiment of the present invention.

According to the fifth embodiment, therefore, the following advantageous effects are achieved in addition to the aforementioned advantages of the third and fourth embodiments. That is, in this fifth embodiment, the constricted portion 2022 is formed by performing an etching using the resist 2075 covering the area of the bump electrode 2016 other than the constricted portion forming region, instead of the metallic layer 2024, as the mask. As a result, there is an increased degree of freedom in both the area for forming the metallic layer 2024 and the area for forming the constricted portion 2022, which allows a choice of optimum areas for both. This further improves the connection reliability between the bump electrode 2016 and the device electrode 2052. Also, an arrangement may be possible without the provision of the metal layer 2024.

Sixth Embodiment

Next, a description will be given of a mobile apparatus (portable device) provided with a semiconductor module according to the above described embodiments. The mobile apparatus presented as an example herein is a mobile phone, but it may be any electronic apparatus, such as a personal digital assistant (PDA), a digital video cameras (DVC) or a digital still camera (DSC).

Figure 22:
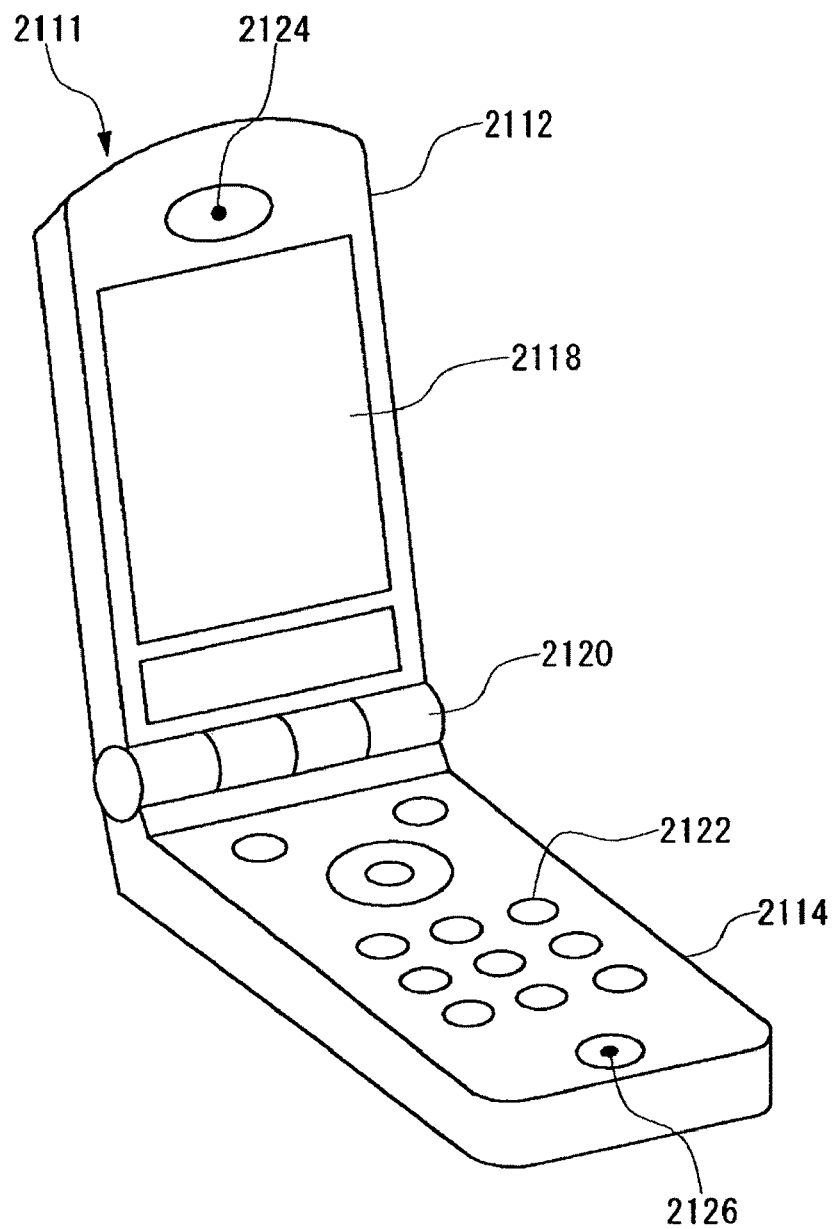
FIG. 22 illustrates a structure of a mobile phone according to a sixth embodiment of the present invention.

FIG. 22 illustrates a structure of a mobile phone provided with a semiconductor module 30, 1030 or 2030 according to the preferred embodiments of the present invention. A mobile phone 2111 has a structure of a first casing 2112 and a second casing 2114 jointed together by a movable part 2120. The first casing 2112 and the second casing 2114 are turnable/rotatable around the movable part 2120 as the axis. The first casing 2112 is provided with the display unit 2118 for displaying characters, images and other information and a speaker unit 2124. The second casing 2114 is provided with a control unit 2122 with operation buttons and a microphone 2126. Note that the semiconductor module 30, 1030 or 2030 according to any of the preferred embodiments of the present invention is mounted within a mobile phone 2111 such as this.

Figure 23:
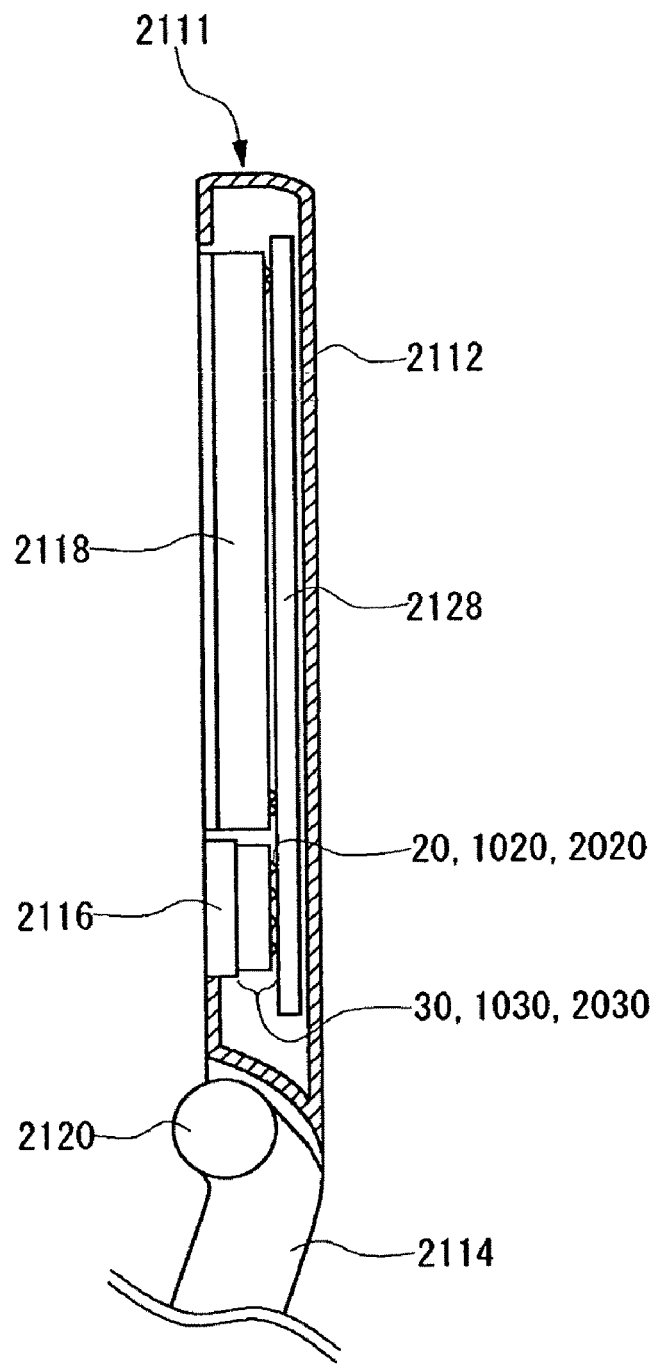
FIG. 23 is a partial cross-sectional view of a mobile phone.

FIG. 23 is a partially schematic cross-sectional view (cross-sectional view of a first casing 2112) of the mobile phone shown in FIG. 22. The semiconductor module 30, 1030 or 2030 according to any of the preferred embodiments of the present invention is mounted on a printed circuit board 2128 via the solder bumps 20, 1020 or 2020, and is coupled electrically to a display unit 2118 and the like by way of the printed circuit board 2128. Also, a radiating substrate 2116, which may be a metallic substrate, is provided on the back side of the semiconductor module 30, 1030 or 2030 (opposite side of solder bumps 20, 1020 or 2020), so that the heat generated from the semiconductor module 30, 1030 or 2030, for example, can be efficiently released outside the first casing 2112 without getting trapped therein.

By employing the device mounting board 10 and the semiconductor module 30 according to the first embodiment, the reliability of mounting the semiconductor module 30 on the printed wiring board improves. Thus, the reliability as to a portable device, provided with such a semiconductor module 30, according to this sixth embodiment improves.

By employing the device mounting board 1010 having the structure of the bump electrodes 1016 and the semiconductor module 1030 according to the second embodiment, the reliability of mounting the semiconductor module 1030 on the printed wiring board improves. Thus, the reliability as to a portable device, provided with such a semiconductor module 1030, according to this sixth embodiment improves.

By employing the device mounting board 2010 having the structure of the bump electrodes 2016 and the semiconductor module 2030 according to each of the third to fifth embodiments, the reliability of mounting the semiconductor module 2030 on the printed wiring board improves. Thus, the reliability as to a portable device, provided with such a semiconductor module 2030, according to this sixth embodiment improves.

The present invention is not limited to the above-described embodiments only, and it is understood by those skilled in the art that various modifications such as changes in design may be made based on their knowledge and the embodiments added with such modifications are also within the scope of the present invention.

For example, in the above-described embodiments, the wiring layer of the device mounting board has a single layer but this should not be considered as limiting and it may be multilayered.

Also, the structure according to the present embodiments is applicable to a process for manufacturing semiconductor packages, which is a so-called wafer-level CSP (Chip Size Package) process. The semiconductor module manufactured by this wafer-level CSP process is made thinner and smaller.

In the above-described third to fifth embodiments, the constricted portion 2022 is provided in a predetermined area including a wiring layer end 2016 of the bump electrode 2016. This constricted portion 2020 may be provided in an area that does not contain the wiring layer end 2016a, namely, in an intermediate area of the side surface of the bump electrode in the protruding direction thereof.

While the preferred embodiments of the present invention and their modifications have been described using specific terms, such description is for illustrative purposes only, and it is to be understood that changes and variations may further be made without departing from the spirit or scope of the appended claims.

What is claimed is:

1. A device mounting board, comprising:
an insulating resin layer;
a wiring layer disposed on one main surface of said insulating resin layer;
a bump electrode connected electrically to said wiring layer and protruding toward said insulating resin layer from said wiring layer; and
a metallic layer which covers a head surface of said bump electrode and a side surface thereof from a head end to a predetermined height;
wherein said bump electrode and said wiring layer are formed integrally with each other, and
wherein a constricted portion is provided in a predetermined area of the side surface of said bump electrode.

2. A device mounting board according to claim 1,
wherein a curvature of a side surface of said bump electrode toward the head of the bump electrode adjacent to an end of the constricted portion toward the head of the bump electrode is larger than a curvature of the side surface of said bump electrode toward the wiring layer adjacent to said end of the constricted portion, and
the side surface of said bump electrode is shaped such that a diameter of the side surface of said bump electrode between the constricted portion and the head becomes progressively smaller toward the head.

3. A device mounting board according to claim 2, wherein the ratio of the diameter of a top to a base of said bump electrode is in the range of about 0.36 to about 0.50.

4. A device mounting board according to claim 1, wherein a side surface of the bump electrode on a side to which the wiring layer extends has a milder slope than that on a side opposite thereto.

5. A device mounting board according to claim 4, wherein the side surface of the bump electrode on the side to which the wiring layer extends has a radius of curvature larger than that of the side surface on the side opposite thereto.

6. A device mounting board according to claim 4, wherein a distance in a direction perpendicular to a protruding direction of said bump electrode from a head end to a wiring layer end thereof at the side surface of the bump electrode on the side to which the wiring layer extends is about 1.0 to about 3.5 times greater than that at the side surface on the side opposite thereto.

7. A device mounting board according to claim 4, wherein said bump electrode is located at least in a corner region in a periphery of said insulating resin layer which is approximately square in shape in a plan view.

8. A device mounting board according to claim 1, wherein the position of an end of the constricted portion on a bump electrode head side is approximately identical to the position of an end of said metallic layer on a wiring layer side.

9. A device mounting board according to claim 1, wherein the position of an end of the constricted portion on a bump electrode head side is not identical to the position of an end of said metallic layer on a wiring layer side.

10. A device mounting board according to claim 1, wherein a surface of the constricted portion is provided with fine asperities, and a surface roughness of the constricted portion is greater than that of the head surface of said bump electrode.

11. A semiconductor module, comprising:
a device mounting board according to claim 1; and
a semiconductor device having a device electrode disposed counter to the bump electrode,
wherein the bump electrode penetrates the insulating resin layer and
the bump electrode and the device electrode are electrically connected to each other.

12. A device mounting board, comprising:
an insulating resin layer;
a wiring layer disposed on one main surface of said insulating resin layer;
a bump electrode connected electrically to said wiring layer and protruding from said insulating resin layer; and
a metallic layer which covers a head surface of said bump electrode and a side surface thereof from a head end to a predetermined height;
wherein said bump electrode and said wiring layer are formed integrally with each other, and
wherein a constricted portion is provided in a predetermined area of the side surface of said bump electrode.

* * * * *